United States Patent

Lowell et al.

[11] Patent Number: 5,804,981
[45] Date of Patent: Sep. 8, 1998

[54] METHOD OF DETECTING HEAVY METAL IMPURITIES INTRODUCED INTO A SILICON WAFER DURING ION IMPLANTATION

[75] Inventors: John K. Lowell, Round Rock; Norman L. Armour; Julia Sherry, both of Austin, all of Tex.

[73] Assignee: Advanced Micro Devices, Inc.

[21] Appl. No.: 643,981

[22] Filed: May 7, 1996

[51] Int. Cl.$^6$ .................................................. G01R 31/302
[52] U.S. Cl. ............................................................. 324/752
[58] Field of Search ................................... 324/751, 752, 324/96; 250/310, 311

[56] References Cited

U.S. PATENT DOCUMENTS

| | | | |
|---|---|---|---|
| 4,181,538 | 1/1980 | Narayan et al. | 438/473 |
| 4,567,431 | 1/1986 | Goodman | 324/752 |
| 4,598,249 | 7/1986 | Goodman et al. | 324/752 |
| 5,025,145 | 6/1991 | Lagowski | 250/214 R |
| 5,471,293 | 11/1995 | Lowell et al. | 356/30 |
| 5,581,194 | 12/1996 | Lowell | 324/752 |

OTHER PUBLICATIONS

Edelman et al., "Surface Charge Imaging in Semiconductor Wafers by Surface Photovoltage (SPV)," Presentation at the Materials Research Society Meeting, Apr. 1992, San Francisco, California. TBP in Conference Proceedings, 6 pages.

Lagowski et al., "Non–contact mapping of heavy metal contamination for silicon ic fabrication," Semicond. Sci. Technol. 7 (1992), pp. A185–A192. (Month Unavailable).

Primary Examiner—Ernest F. Karlsen
Assistant Examiner—Russell M. Kobert
Attorney, Agent, or Firm—Kevin L. Daffer; Conley, Rose & Tayon

[57] ABSTRACT

The present method allows detection of heavy metal impurities introduced into a silicon wafer during an ion implantation procedure. The method is quick, non-destructive, and functions in the presence of extensive lattice damage created during ion implantation. A thermal treatment follows ion implantation to cause any heavy metal impurities to diffuse into near-surface regions adjacent to major surfaces. A major surface of the silicon wafer is subjected to a high-injection SPV frequency sweep procedure before and after the thermal treatment. During each high-injection SPV frequency sweep procedure, the major surface is subjected to a train of light pulses modulated at frequencies within a frequency range of interest spanning from a low frequency cutoff (about 280 Hz) to a high frequency cutoff (about 10 kHz). Surface charge values are derived from surface photovoltages measured at each modulation frequency. Ratios of surface charge values corresponding to endpoints of the frequency range of interest are used to gauge generation lifetimes before and after the thermal treatment. A decrease in generation lifetime following the thermal treatment indicates the introduction and subsequent diffusion of heavy metal contaminants into the near-surface region adjacent to the analyzed surface.

34 Claims, 19 Drawing Sheets

METHOD OF DETECTING HEAVY METAL IMPURITIES INTRODUCED INTO A SILICON WAFER DURING ION IMPLANTATION

BACKGROUND OF THE INVENTION

1. Field of the Invention

This invention relates to semiconductor device manufacture and more particularly to a method of detecting the presence of heavy metal impurities within a silicon wafer.

2. Description of the Relevant Art

Ion implantation is a physical process in which ionized dopant species (i.e., implant species) are directly introduced into a single-crystal silicon wafer. Charged implant species are accelerated to a high velocity and formed into a narrow beam. The narrow beam is then systematically scanned across an exposed surface of the silicon wafer. As a result, the implant species enter the exposed surface of the silicon wafer and come to rest within the wafer at some distance below the exposed surface. Ion implantation is primarily used to place dopant atoms within defined regions of silicon wafers. As semiconductor device dimensions shrink, ion implantation is steadily replacing chemical diffusion doping due primarily to the ability to more precisely control the placement of dopant atoms within semiconductor wafers.

The major drawback associated with ion implantation is that it operates in a manner which damages the crystalline lattice structure of the target silicon wafer. Implant species enter the exposed surface of the silicon wafer and are slowed by collisions with silicon atoms occupying lattice sites within the crystal. Silicon atoms involved in such collisions are often displaced from their lattice sites. The amount of damage incurred by the lattice structure during an ion implantation procedure may range from isolated single lattice vacancies, or clusters of single lattice vacancies, to localized zones in which a majority of the silicon atoms have been displaced from their lattice sites (i.e., amorphous regions). Severe lattice damage results in extended regions in which a majority of the silicon atoms have been displaced from their lattice sites (i.e., continuous amorphous layers). Fortunately, a heat treatment called an annealing process performed following an ion implantation procedure is often able to repair almost all of the damage caused to the crystalline lattice of a silicon wafer.

As used herein, the term defect refers to any non-uniform material or structure present within a monolithic crystalline substrate which may negatively impact device performance. The lattice structure of a semiconductor wafer may develop a defect during manufacture of the wafer itself, or during subsequent device fabrication procedures such as ion implantation. In addition to lattice damage which is not repaired during a subsequent annealing process, ion implantation may also introduce unwanted impurities (i.e., contaminants) into a silicon wafer along with implant species. Many of the components which make up apparatus used for ion implantation (i.e., ion implanters) are made of metal. Atoms of these metallic components may be removed when struck by beams of implant species formed within the ion implanters. These metal atoms may be incorporated into implant beams and implanted into target silicon wafers along with the implant species. Most metallic components of ion implanters are alloys of steel, thus the major metallic contaminant introduced during an ion implantation procedure is iron.

Minority carrier lifetime is defined as the amount of time minority charge carriers exist before recombining with majority charge carriers to re-establish a thermal equilibrium charge carrier concentration. In general, long minority carrier lifetimes are beneficial to semiconductor device operation. Heavy metals include iron (Fe), copper (Cu), nickel (Ni), and gold (Au). Atoms of heavy metals form sites where minority and majority charge carriers have a tendency to recombine (i.e., recombination centers). Such recombination centers which exist within regions near a surface of a silicon wafer where active devices reside (i.e., device active areas) represent defects as they lead to reduced minority carrier lifetimes.

In order to determine the source of a given contaminant, it is often necessary to examine product wafers (i.e., wafers expected to yield operational devices) before and after each processing step. Having the ability to examine product wafers at various stages in a processing line for the presence of contaminants, without damaging the wafers, allows continuous monitoring of contaminant levels without the need for dedicated test wafers. Test wafers, typically included in every grouping of wafers and processed in an identical process run as product wafers, represent a reduction in manufacturing yield as they do not produce operational devices.

Silicon wafers have two major surfaces, referred to herein as a frontside surface and a backside surface. During ion implantation, backside surfaces of silicon wafers come into direct contact with metal surfaces of wafer clamps used to hold the wafers in place, and frontside surfaces are subjected to beams of implant species. Thus atoms of heavy metals may be introduced into a silicon wafer through the frontside surface, the backside surface, or through both surfaces during an ion implantation procedure. In order to eliminate a source of heavy metal contamination, the surface or surfaces through which heavy metals are introduced into silicon wafers during ion implantation must first be identified. Elevated temperatures associated with annealing procedures commonly performed following ion implantation allow any heavy metal contaminants introduced into a silicon wafer to diffuse uniformly throughout the wafer, making surface introduction identification impossible. A non-destructive analysis technique is thus needed which can quickly detect the presence of one or more heavy metal contaminants within regions near major surfaces of product wafers following an ion implantation procedure and prior to an annealing procedure. Such a method would allow the determination of the surface or surfaces through which heavy metal contaminants entered the silicon wafer during ion implantation.

Several quantitative diagnostic techniques may be employed to determine the elemental compositions of one or more heavy metal contaminants within silicon wafers. Such diagnostic techniques include secondary ion mass spectroscopy (SIMS), Auger emission spectroscopy (AES), and X-ray fluorescence spectroscopy (XRF). In SIMS techniques, a mass spectrometer is used to identify the elemental compositions of small pieces of materials dislodged from wafer surfaces by ion bombardment. AES techniques involve directing a beam of primary electrons at the surface of a silicon wafer and measuring the energy levels of emitted secondary electrons to determine elemental compositions of surface structures. In XRF techniques, a beam of primary X-rays is directed at the surface of a semiconductor wafer, and the energy levels (or corresponding wavelengths) of resultant secondary X-rays emitted by atoms of elements on and just under the surface of the wafer are measured. Atoms of elements in target materials emit secondary X-rays with uniquely characteristic energy levels (or corresponding wavelengths).

All three of the above diagnostic techniques are basically surface analysis techniques. In order to determine elemental compositions in regions of a silicon wafer below the surface, such regions must first be exposed for analysis. Exposing such regions involves removing material from an upper portion of the wafer. Application of SIMS, AES, and XRF diagnostic techniques to detect the presence of heavy metal contaminants within a silicon wafer are thus destructive in nature, relatively expensive, and cannot be performed on product wafers.

Non-destructive surface photovoltage (SPV) techniques. are commonly employed to measure minority carrier diffusion lengths in an effort to detect the presence of heavy metal impurities within near-surface regions of silicon wafers. FIGS. 1a and 1b will be used to describe a typical SPV analysis technique. FIG. 1a is a block diagram of a typical SPV test apparatus 10. A light source 14 includes an illumination source 16 and a rotating chopper 18. Light source 14 also includes an illumination attenuator and a set of filters for wavelength selection (not shown). Rotating chopper 18 of light source 14 modulates a beam of monochromatic light 20 produced by illumination source 16. Light source 14 thus produces a train of monochromatic light pulses 22 with constant photon flux at each available wavelength. The train of monochromatic light pulses 22 passes through a housing 24 and strikes the surface of a silicon wafer 12 positioned upon an electrically grounded base plate 26.

The wavelengths of the incident light are chosen such that the corresponding energy levels of the photons making up the incident light are greater than the bandgap of silicon wafer 12. FIG. 1b is a partial cross-sectional view of silicon wafer 12 undergoing SPV analysis. Photons making up the train of monochromatic light pulses 22 penetrate silicon wafer 12 to depths of from 10 microns to 150 microns as shown. Excess charge carriers (holes and electrons) are formed when photons of the incident light are absorbed by silicon atoms within silicon wafer 12. These excess charge carriers diffuse to the surface of silicon wafer 12, where they become separated by an electric field of a surface space charge region and produce a surface photovoltage.

A pickup electrode 28 sends an electrical signal reflecting the level of the surface photovoltage of silicon wafer 12 to lock-in amplifier 30. Lock-in amplifier 30 is synchronized with rotating chopper 18 of light source 14 via an electrical signal from light source 14. Lock-in amplifier 30 provides an output signal reflecting the resultant level of surface photovoltage produced by silicon wafer 12 to a data processor 32. Data processor 32 calculates the average minority carrier diffusion length in silicon wafer 12 from measured surface photovoltages using known values of photon flux at incident wavelengths and the corresponding absorption coefficients. Minority carrier diffusion lengths are inversely related to heavy metal contaminant concentrations. Examples of SPV techniques are provided in U.S. Pat. Nos. 4,567,431; 5,025, 145; 5,471,293; and Lagowski, et al., "Non-Contact Mapping of Heavy Metal Contamination for Silicon IC Fabrication," IOP Publishing, Ltd. 1992, pp. A185–A192 (each of which are herein incorporated by reference).

Extensive lattice damage remaining after ion implantation prevents the use of conventional SPV techniques to detect the presence of heavy metal contaminants. In a typical ion implantation procedure, a layer of an implant species (i.e., an implant layer) is formed below the frontside surface of the silicon wafer. A region of extensive lattice damage typically surrounds the implant layer. Recombination centers formed in the region of extensive lattice damage prevents many of the minority charge carriers produced below the region of extensive lattice damage from reaching the surface of the silicon wafer and producing a surface photovoltage during analysis. Thus conventional SPV techniques cannot be used to detect the presence of heavy metal contaminants in silicon wafers having regions of extensive lattice damage due to ion implantation.

It would, however, be desirable to have a non-destructive analysis method based on SPV techniques and capable of rapidly detecting the presence of one or more heavy metal contaminants within a silicon wafer having regions of extensive lattice damage resulting from ion implantation. Such a method would not only allow detection of heavy metal contaminants introduced into the silicon wafer during ion implantation, but would also aid a determination of the surface or surfaces through which the heavy metal contaminants entered the silicon wafer.

SUMMARY OF THE INVENTION

The problems outlined above are in large part solved by a method of detecting the presence of one or more heavy metal impurities introduced into a silicon wafer during an ion implantation procedure. The method is quick, non-destructive, and functions in the presence of extensive lattice damage created during the ion implantation procedure. A thermal treatment is carried out following ion implantation to cause any heavy metal impurities to become highly mobile within the silicon wafer. At least one major surface of the silicon wafer is subjected to a high-injection SPV frequency sweep procedure before and after the thermal treatment. During each high-injection SPV frequency sweep procedure, a major surface of the silicon wafer is subjected to a train of light pulses modulated at frequencies within a frequency range of interest. The frequency range of interest spans from a low frequency cutoff (about 280 Hz) to a high frequency cutoff (about 10 kHz). Surface charge values are derived from surface photovoltages measured at each modulation frequency. Ratios of surface charge values corresponding to endpoints of the frequency range of interest are used to gauge generation lifetimes before and after the thermal treatment. A decrease in generation lifetime following the thermal treatment indicates the introduction and subsequent diffusion of heavy metal contaminants into the near-surface region associated with the analyzed surface.

During the high-injection SPV frequency sweep procedure, the silicon wafer is positioned within an SPV test apparatus producing pulses of light with wavelengths between 800 and 850 nanometers. The corresponding energy levels of photons making up the incident light are much greater than the bandgap of the silicon wafer. As a result, a relatively large number of excess charge carriers (holes and electrons) are created when photons of the incident light are absorbed by silicon atoms within the silicon wafer. The exposed surface of the silicon wafer is then subjected to light pulses modulated at frequencies spanning a frequency range of interest, and the resultant surface photovoltages produced at each modulation frequency are measured. A surface charge is then derived from each measured surface photovoltage according to an accepted relationship. An optional graph of derived surface charge versus light pulse modulation frequency may then be formed by plotting each derived surface charge at the corresponding light pulse modulation frequency.

Both a frontside and a backside surface of a silicon wafer may be analyzed to determine whether heavy metal impurities were introduced through one or both major surfaces during the ion implantation procedure. During ion implantation, heavy metal impurities may be introduced into a beam of dopant ions and implanted along with the dopant ions through the frontside surface. Heavy metal impurities may also be introduced through the backside surface during contact with metallic components of wafer clamps used to secure the wafers during ion implantation. Ion implantation results in the formation of an implant layer below a near-surface region adjacent to the frontside surface. Extensive lattice damage surrounding the implant layer prevents any heavy metal impurities introduced through the frontside surface from diffusing into the near-surface region adjacent to a backside surface during the thermal treatment. Similarly, the extensive lattice damage prevents any heavy metal impurities introduced through the backside surface from diffusing into the near-surface region adjacent to the frontside surface during the thermal treatment. Thus only heavy metal impurities introduced through the frontside surface diffuse into the near-surface region adjacent to the frontside surface during the thermal treatment, and a similar relationship exists for the backside surface. Analysis of a major surface in accordance with the present invention thus allows the detection of heavy metal impurities introduced through the major surface undergoing analysis.

Any heavy metal contaminants introduced through an analyzed surface diffuse into the near-surface region adjacent to the analyzed surface during the thermal treatment, resulting in a decrease in generation lifetime following the thermal treatment. Ratios of surface charge values measured at endpoints of the frequency range of interest are used to gauge generation lifetime reductions. A first ratio involves surface charge values measured before thermal treatment. The first ratio is derived by dividing a surface charge value measured at the low frequency cutoff by a surface charge value measured at the high frequency cutoff. A second ratio involves surface charge values measured after thermal treatment. The second ratio is derived by dividing a surface charge value measured at the low frequency cutoff by a surface charge value measured at the high frequency cutoff. A relatively low concentration of heavy metal contaminants in the near-surface region adjacent to the analyzed surface prior to the thermal treatment results in a relatively long generation lifetime and a relatively high first ratio. The concentration of heavy metal contaminants in the near-surface region may be increased following the thermal treatment due to diffusion, resulting in a shorter generation lifetime and a lower second ratio. The presence of a heavy metal impurity introduced through the analyzed surface of the silicon wafer during ion implantation is thus indicated by a second ratio which is at least 10 percent lower than the first ratio.

BRIEF DESCRIPTION OF THE DRAWINGS

Other objects and advantages of the invention will become apparent upon reading the following detailed description and upon reference to the accompanying drawings in which.

Figure 1A:
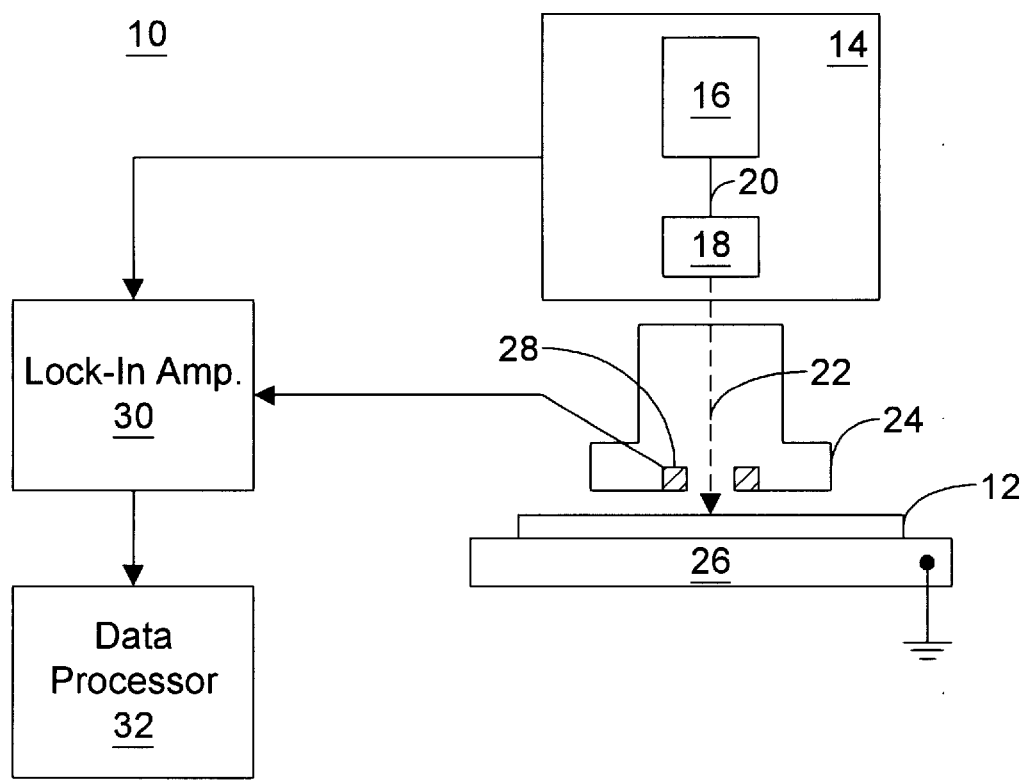
FIG. 1a is a block diagram of a typical SPV test apparatus.
Figure 1B:
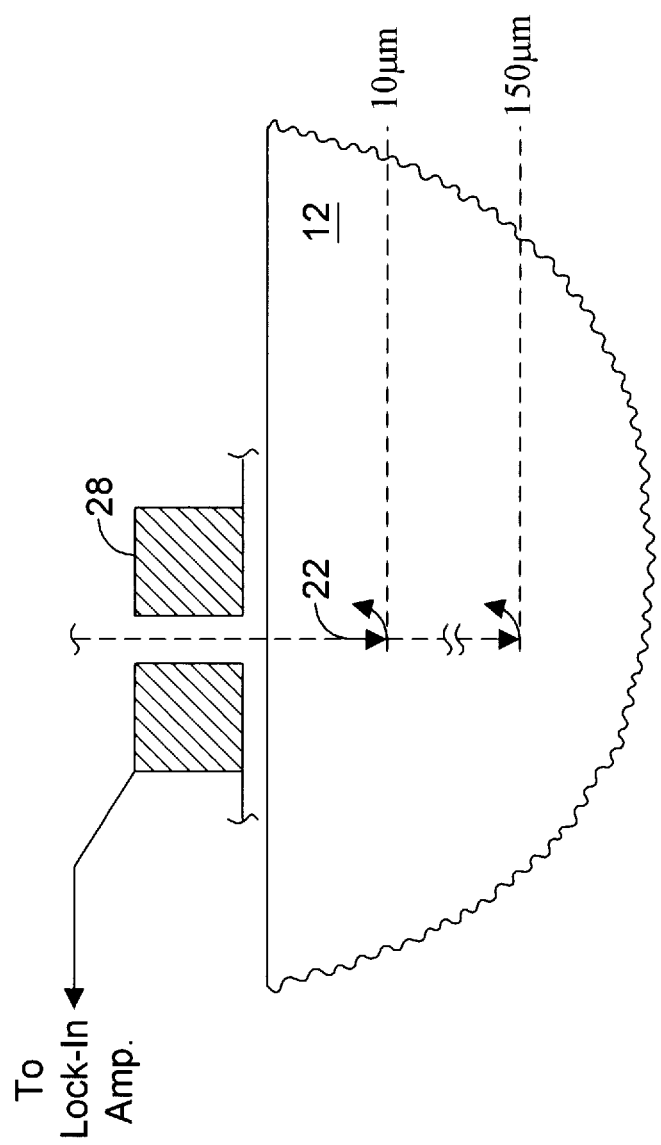
FIG. 1b is a partial cross-sectional view of a silicon wafer undergoing conventional SPV analysis.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Surface charge imaging (SCI) is a relatively new technique which may be used to detect the presence of a heavy metal impurity within a near-surface region of a silicon wafer. As defined herein, a near-surface region of a silicon wafer extends from just below a given surface of a silicon wafer to a depth (i.e., elevation level relative to the surface) of about 100 angstroms. SCI employs SPV methods and high photon excitation levels. Like SPV, the SCI technique is non-contact and non-destructive. High energy photons produce a large number of excess charge carriers when absorbed within a silicon wafer undergoing analysis. A resulting surface photovoltage approaches a saturation value as energy bands become almost flat at the surface of the silicon wafer. Surface charge is then derived from measured surface photovoltage using an accepted equation described by P. Edelman, et al., "Surface Charge Imaging in Semiconductor Wafers by Surface Photovoltage (SPV)," Proceedings of the Materials Research Society Meeting, San Francisco, Calif., April, 1992 (incorporated herein by reference):

$$\text{Surface Charge} = Q_{SC} = [n_i L] F(V_g)$$

where $$F(V_g) = \pm [p_o/n_i(e^{-V_g}-1) + n_i/p_o(e^{-V_g}-1) + (p_o/n_i - n_i/p_o)V_g]^{1/2},$$

$V_g$=measured surface photovoltage,
$n_i$=intrinsic carrier concentration,
L=characteristic screening length, and
$p_o$=free hole concentration.

Figure 2:
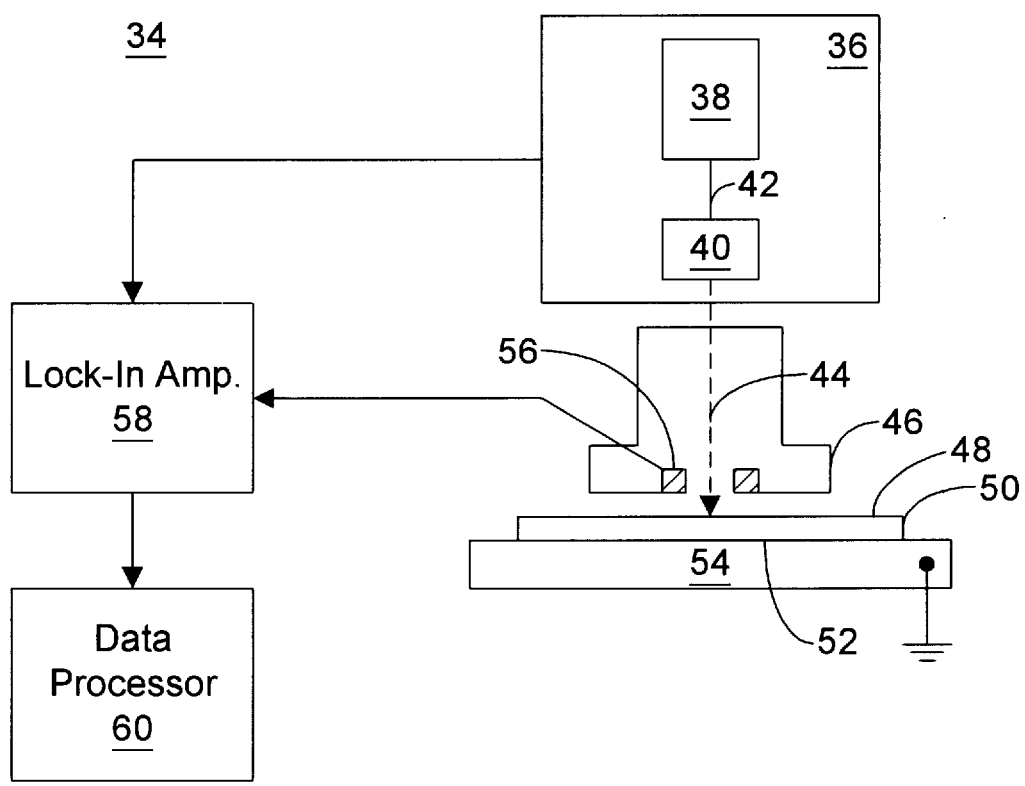
FIG. 2 is a block diagram of a high-injection SPV analysis apparatus.

FIG. 2 is a block diagram of a high-injection SPV analysis apparatus 34 which may be used to carry out the method. A light source 36 includes an illumination source 38 and a rotating chopper 40. Illumination source 38 includes a high-intensity GaAlAs heterostructure diode dissipating approximately 0.5 watts and emitting monochromatic light with a wavelength of about 830 nanometers. Rotating chopper 40 modulates a beam of monochromatic light 42 produced by illumination source 38. Light source 36 thus produces a train of monochromatic light pulses 44 with constant photon flux. The train of monochromatic light pulses 44 passes through a housing 46 and strikes a frontside surface 48 of a silicon wafer 50. Frontside surface 48 of silicon wafer 50 is thus the exposed surface (i.e., the surface exposed to light pulses). During the analysis, a backside surface 52 of silicon wafer 50 is positioned upon an electrically grounded base plate 54.

It is noted that analysis of a near-surface region of backside surface 52 of silicon wafer 50 may be performed by turning silicon wafer 50 over. In this case, backside surface 52 is the exposed surface, the train of monochromatic light pulses 44 striking backside surface 52 while frontside surface 52 is positioned upon electrically grounded base plate 54.

The energy levels of the photons making up the incident light are much greater than the bandgap of silicon wafer 50, resulting in the generation of a relatively large number of excess charge carriers (holes and electrons) when photons of the incident light are absorbed by silicon atoms within silicon wafer 50. These excess charge carriers diffuse to the exposed surface of silicon wafer 50, where they become separated by the electric field of a surface space charge region and produce a surface photovoltage. Under illumination, the space charge region extends from the exposed surface of silicon wafer 50 to a depth of about 80 angstroms. The surface photovoltage produced at the exposed surface approaches a saturation value as the energy bands become almost flat at the exposed surface. Pickup electrode 56, located in close proximity to but not touching the exposed surface, sends an electrical signal reflecting the level of the surface photovoltage to a lock-in amplifier 58. Lock-in amplifier 58 is synchronized with rotating chopper 40 of light source 36 via an electrical signal from light source 36. Lock-in amplifier 58 provides an output signal reflecting the resultant level of surface photovoltage to a data processor 60. Data processor 60 calculates a corresponding surface charge value from the measured surface photovoltage using the above accepted relationship.

A frequency sweep technique allows separation of surface charge by frequency wherein changes in measured photovoltage values (and derived surface charge) may be evaluated in order to detect the presence of heavy metal contaminants. The varying modulation frequencies of the train of monochromatic light pulses 44 provide a stimulus for materials and structures within silicon wafer 50.

Light modulation frequencies used during the high-injection SPV frequency sweep cover a frequency range of interest. The frequency range of interest is determined by the doping level of the silicon wafer, and spans from a low frequency cutoff (about 280 Hz) to a high frequency cutoff (about 10 kHz). Any decrease in surface charge values in the frequency range of interest is chiefly due to near-surface effects, most notably reduced generation lifetime occurring in the near-surface region. Reduced generation lifetime may result from a large number of crystalline defects (e.g., lattice damage due to ion implantation), a relatively high concentration of heavy metal contaminants, or both of the above conditions.

Light modulation frequencies used during the high-injection SPV frequency sweep may also cover frequencies above and below the frequency range of interest. At frequencies below the low frequency cutoff of the frequency range of interest, surface charge values are directly dependent on concentrations of mobile ionic impurities (e.g., $Na^+$, $K^+$, $Li^+$, and $H^+$) located within the near-surface region adjacent to the exposed surface. At frequencies above the high frequency cutoff of the frequency range of interest, surface charge values are dominated by a saturation effect. Few charge carriers are generated or released during the ultra-short periods of illumination and non-illumination.

An experiment was conducted to show that the high-injection SPV frequency sweep method was capable of detecting and determining the surface or surfaces through which heavy metal contaminants entered silicon wafers during an ion implantation procedure. During the experiment, four p-type <100>, 150 mm CZ bulk silicon wafers were subjected to ion implantation of 80 keV arsenic (As) atoms at a dose of $5.0 \times 10^{15}$ atoms/cm$^2$. A single reference wafer was not subjected to implantation processing or a subsequent thermal treatment. Two control wafers were subjected to only the thermal treatment. Two processed wafers were processed along with the implanted wafers, but were not subjected to ion implantation.

Prior to implantation processing of the processed and implanted wafers, the control wafers, the processed wafers., and the implanted wafers were all subjected to a first high-injection SPV frequency sweep analysis. During high-injection SPV frequency sweep analyses, the monochromatic laser light produced by the illumination source was modulated over a range of frequencies extending from about 10 Hz to about 100 kHz. Based on the doping levels, a frequency range of interest was chosen spanning from a low frequency cutoff of 280 Hz to a high frequency cutoff of 10 kHz.

Following the first high-injection SPV frequency sweep analyses, the processed and implanted wafers were subjected to implantation processing. As mentioned above, the processed wafers were processed along with the implanted wafers, but were not implanted with dopant ions. Ion implantations resulted in the formations of As implant layers at depths of about 500 angstroms below the frontside surfaces of the four implanted wafers. It is noted that these implant layers are below the near-surface region adjacent to the frontside surface.

Figure 3:
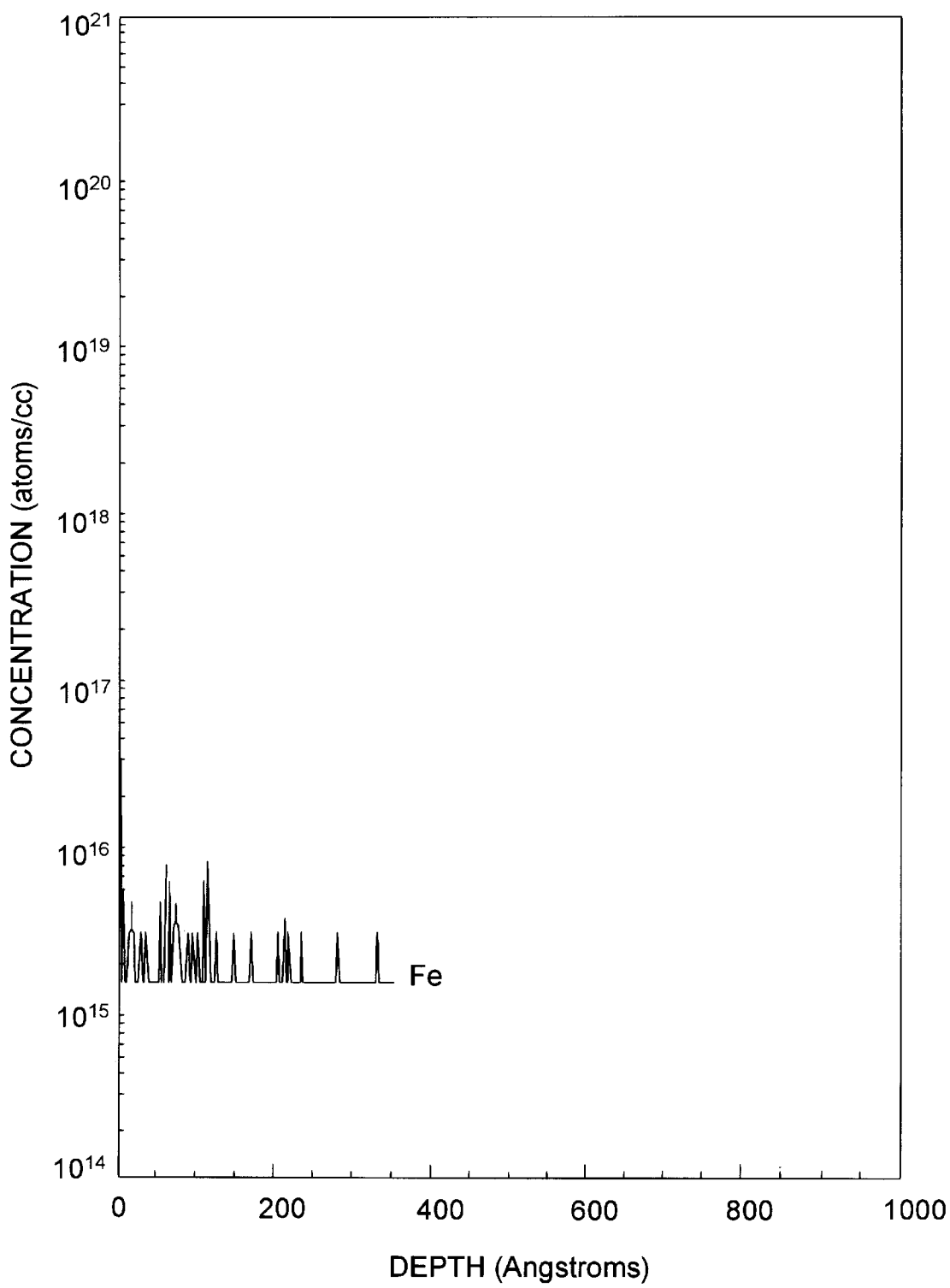
FIG. 3 is a SIMS plot of Fe concentration versus depth within a reference wafer relative to a frontside surface.
Figure 4:
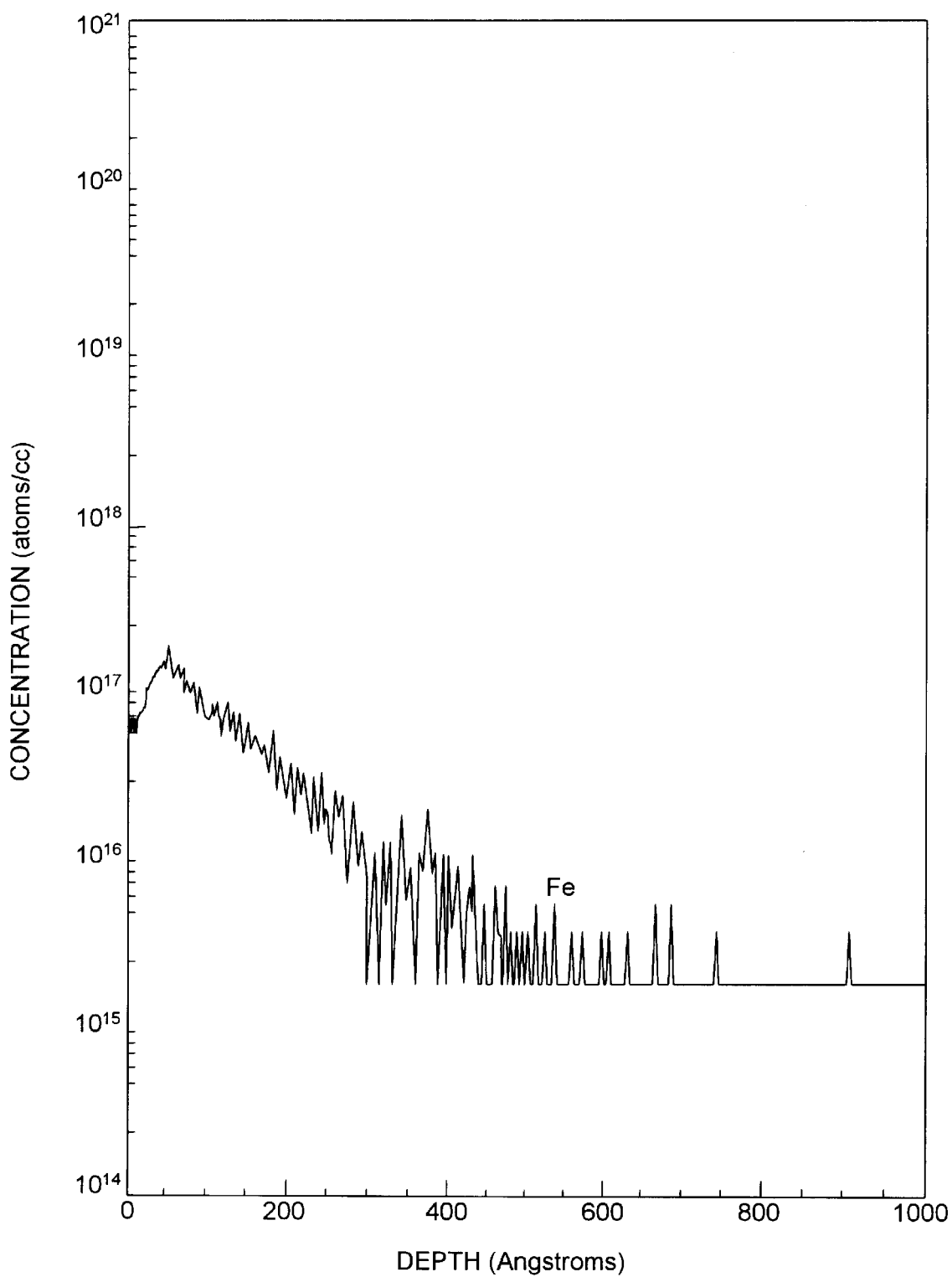
FIG. 4 is a SIMS plot of Fe concentration versus depth within an implanted wafer relative to a frontside surface following an ion implantation procedure and prior to a thermal treatment.

Following implantation processing, the reference wafer and one implanted wafer were divided, and pieces of each wafer were subjected to SIMS analyses. FIG. 3 is a SIMS plot of Fe concentration versus depth below a frontside surface the reference wafer. SIMS analysis of the reference wafer revealed an Fe concentration of about $4.0 \times 10^{16}$ atoms/$cm^3$ at the frontside surface and a very rapid decrease in Fe concentration with increasing depth into the processed wafer. FIG. 4 is a SIMS plot of Fe concentration versus depth below a frontside surface the implanted wafer. The Fe concentration in the implanted wafer was about $7.0 \times 10^{16}$ atoms/$cm^3$ at the frontside surface, increased to about $1.4 \times 10^{17}$ atoms/$cm^3$ at a depth of about 50 angstroms below the frontside surface, then decreased to about $2.0 \times 10^{15}$ atoms/$cm^3$ at the As implant layer depth of about 500 angstroms. A significant number of Fe atoms were thus introduced along with As dopant atoms into the implanted wafer through the frontside surface during the ion implantation procedure. In addition, most of the Fe atoms came to rest at shorter distances from the frontside surface than the As dopant atoms.

The processed wafers, the three remaining implanted wafers, and the control wafers were then subjected to a thermal treatment, during which the wafers were heated to about 220° C. for approximately 2.5 minutes. Atoms of heavy metals located in open areas between lattice sites (i.e., in interstices) are highly mobile and effective recombination centers. At room temperature, however, interstitial iron atoms are unstable, and tend to form stable pairs with dopant atoms occupying lattice sites. Such stable pairs are less effective recombination centers than interstitial Fe atoms. SPV techniques thus cannot accurately determine Fe atom concentrations when a significant portion of the Fe atoms exist as members of such stable pairs. Heating the silicon wafer breaks up stable Fe-dopant pairs. The purpose of the thermal treatment is thus to break up any stable pairs and cause any heavy metal impurities within the wafers to become highly mobile. It is noted that the elevated temperatures involved in the thermal treatment were not high enough to repair lattice damage or electrically activate implanted species.

During ion implantation, heavy metal impurities may be introduced into a beam of dopant ions and implanted along with the dopant ions through a frontside surface. Heavy metal impurities may also be introduced through a backside surface during contact with metallic components of wafer clamps used to secure the wafers during ion implantation. Ion implantation also results in a region of extensive lattice damage surrounding the implant layer. The region of extensive lattice damage prevents any heavy metal impurities introduced through the frontside surface from diffusing into the near-surface region adjacent to a backside surface during the thermal treatment. Similarly, the extensive lattice damage prevents any heavy metal impurities introduced through the backside surface from diffusing into the near-surface region adjacent to the frontside surface during the thermal treatment. Thus only heavy metal impurities introduced through the frontside surface diffuse into the near-surface region adjacent to the frontside surface during the thermal treatment, and a similar relationship exists for the backside surface.

Figure 5:
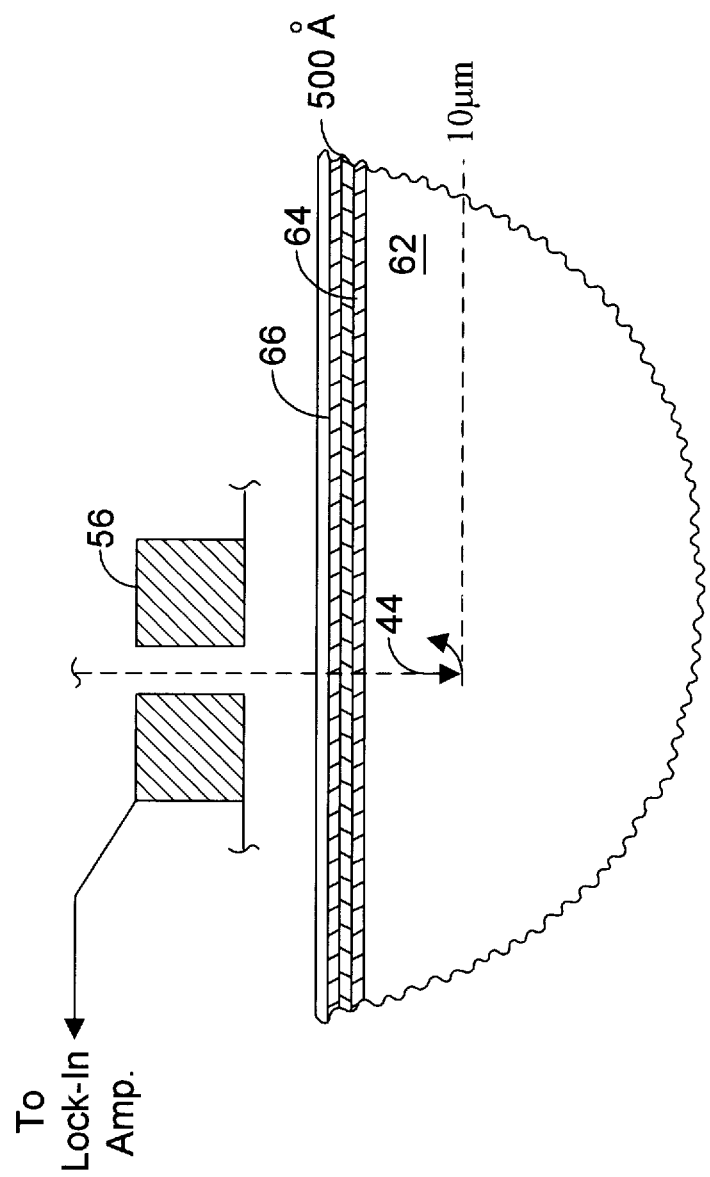
FIG. 5 is a partial cross-sectional view of an implanted silicon wafer undergoing a second high-injection SPV analysis following the ion implantation procedure and thermal treatment.

Following the thermal treatment, the control wafers, the processed wafers, and the three remaining implanted wafers were all subjected to a second high-injection SPV frequency sweep analysis. The second high-injection SPV frequency sweep analyses were carried out just like the first high-injection SPV frequency sweep analyses described above. FIG. 5 is a partial cross-sectional view of a frontside surface of an implanted silicon wafer 62 undergoing a second high-injection SPV analysis. Implanted wafer 62 has an As implant layer 64 formed at a depth of about 500 angstroms by ion implantation. Implant layer 64 is surrounded by a region of extensive lattice damage 66. Photons making up the train of monochromatic light pulses 44 penetrate the exposed surface of silicon wafer 50 to depths of up to about 10 microns as shown. It is noted that recombination centers are formed in region of extensive lattice damage 66 and continue to exist after the thermal treatment. Although these recombination centers prevent many of the minority charge carriers produced below region of extensive lattice damage 66 from reaching the surface of silicon wafer 62 and producing a surface photovoltage, results of high-injection SPV analyses are dominated by near-surface effects. Thus any recombination centers (e.g., atoms of heavy metals) existing in the near-surface region have a much greater impact on the results of a highinjection SPV analysis than any recombination centers existing below the near-surface region.

Figure 6A:
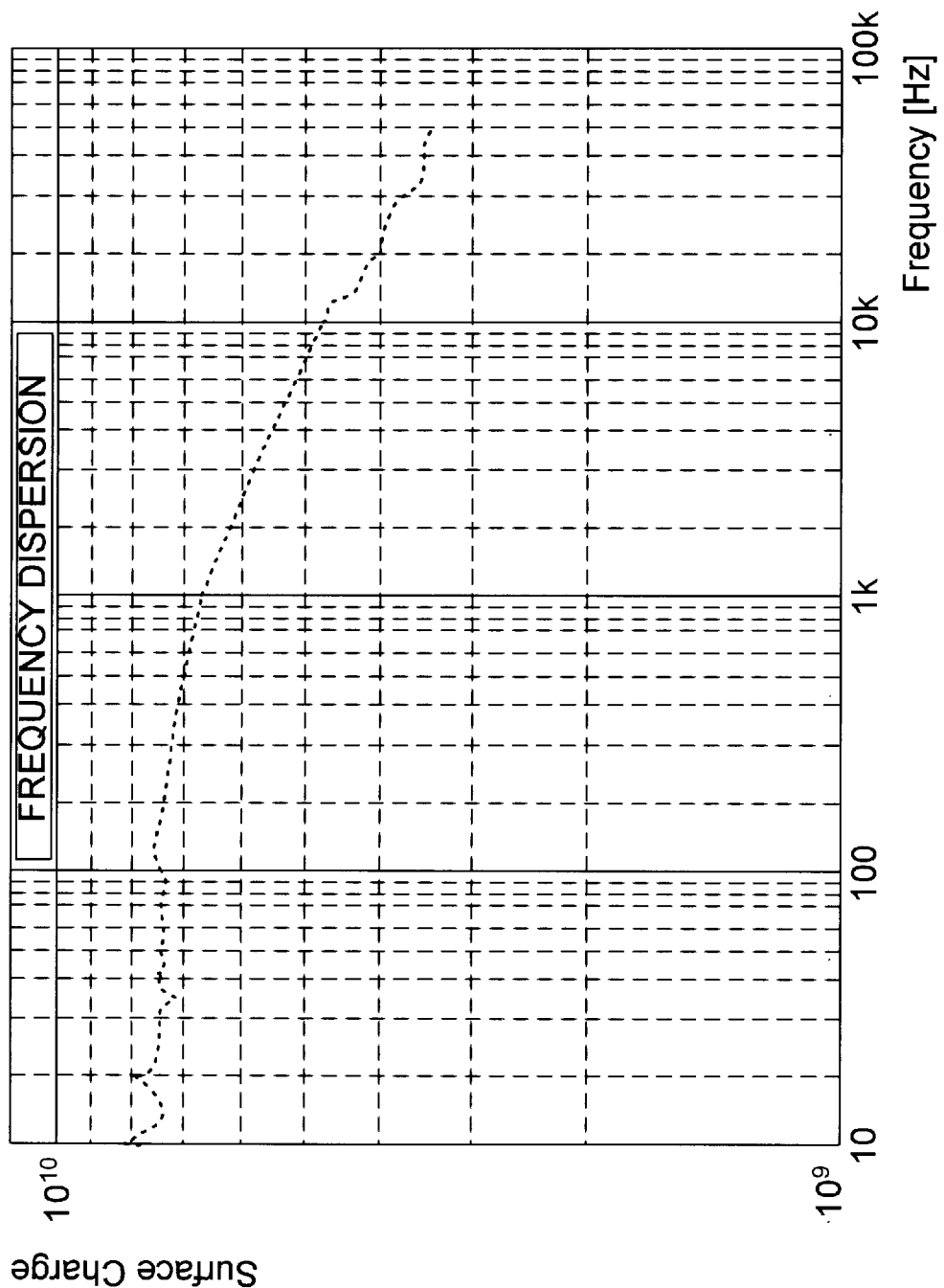
FIG. 6a is a graph of surface charge versus light modulation frequency obtained during a first high-injection SPV frequency sweep of a frontside surface of a control wafer prior to thermal treatment.
Figure 6B:
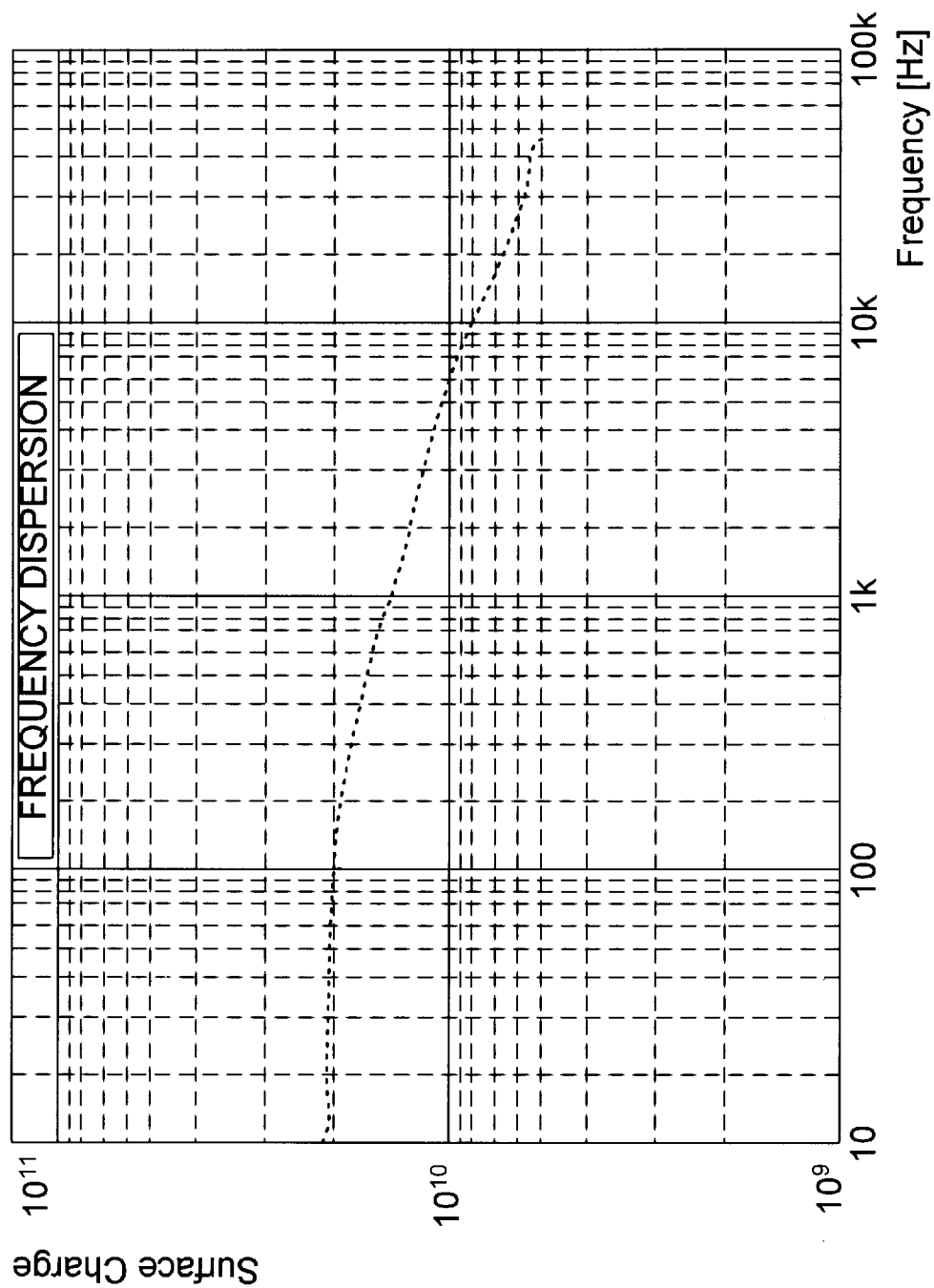
FIG. 6b is a graph of surface charge versus light modulation frequency obtained during a second high-injection SPV frequency sweep of the frontside surface of the control wafer following thermal treatment.

FIG. 6a is a graph of surface charge versus light modulation frequency obtained during a first high-injection SPV frequency sweep of a frontside surface of a control wafer prior to thermal treatment. Surface charge is almost constant at light modulation frequencies below the low frequency cutoff of the frequency range of interest, and decreases gradually with increasing light modulation frequency. FIG. 6b is a graph of surface charge versus light modulation frequency obtained during a second high-injection SPV frequency sweep of the frontside surface of the control wafer following thermal treatment. Again, surface charge is almost constant at light modulation frequencies below the low frequency cutoff of the frequency range of interest, and decreases gradually with increasing light modulation frequency. The curve of FIG. 6b is basically the curve of FIG. 6a with an upward vertical shift. It is postulated that the upward vertical shift is due to organic substances present on the frontside surface prior to thermal treatment and "burned off" as the wafer was heated during the thermal treatment. The fact that the curve of FIG. 6b is almost identical to the curve of FIG. 6a shows that no heavy metal impurities were introduced into the frontside surface of the control wafer during the thermal treatment.

Figure 7A:
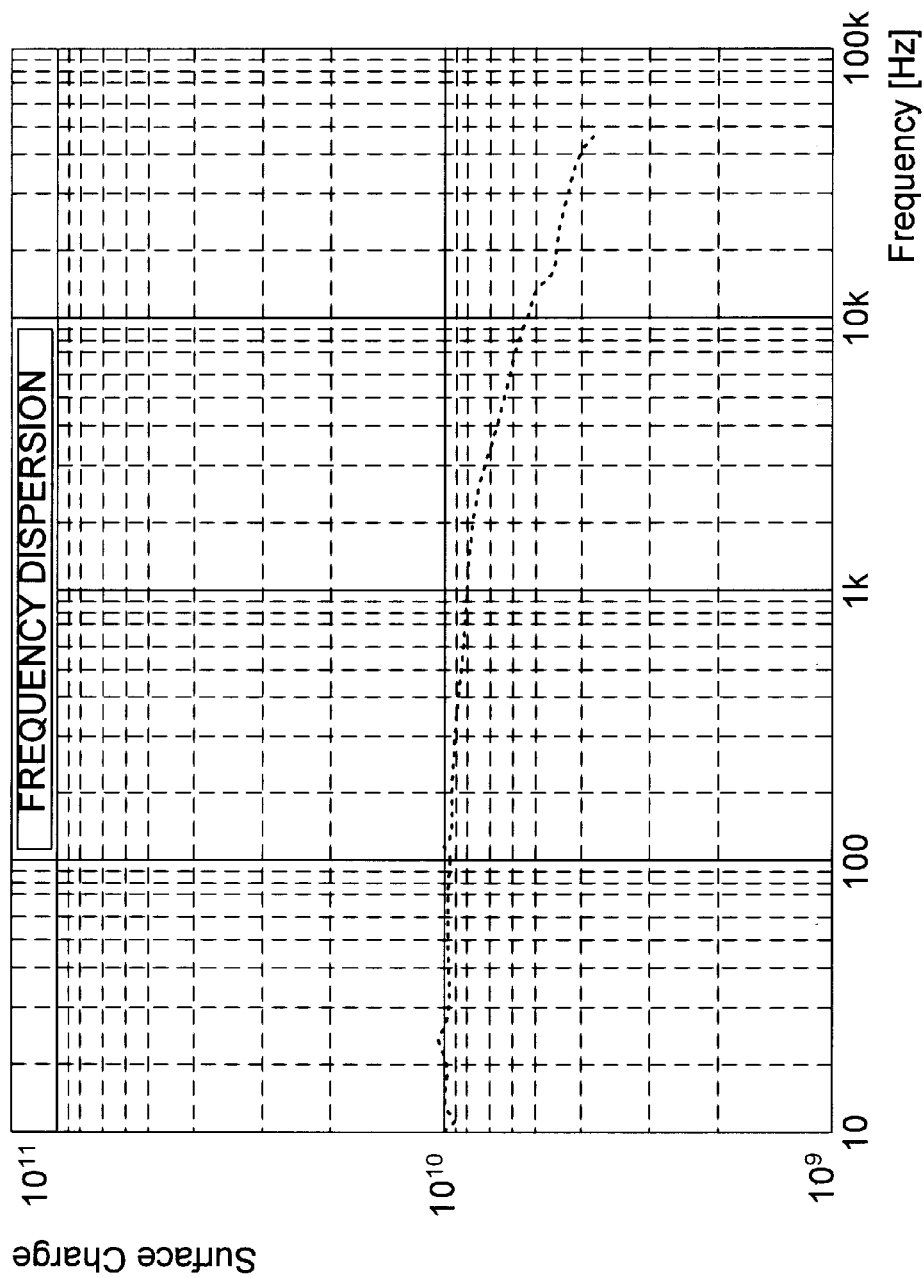
FIG. 7a is a graph of surface charge versus light modulation frequency obtained during a first high-injection SPV frequency sweep of a backside surface of the control wafer prior to thermal treatment.
Figure 7B:
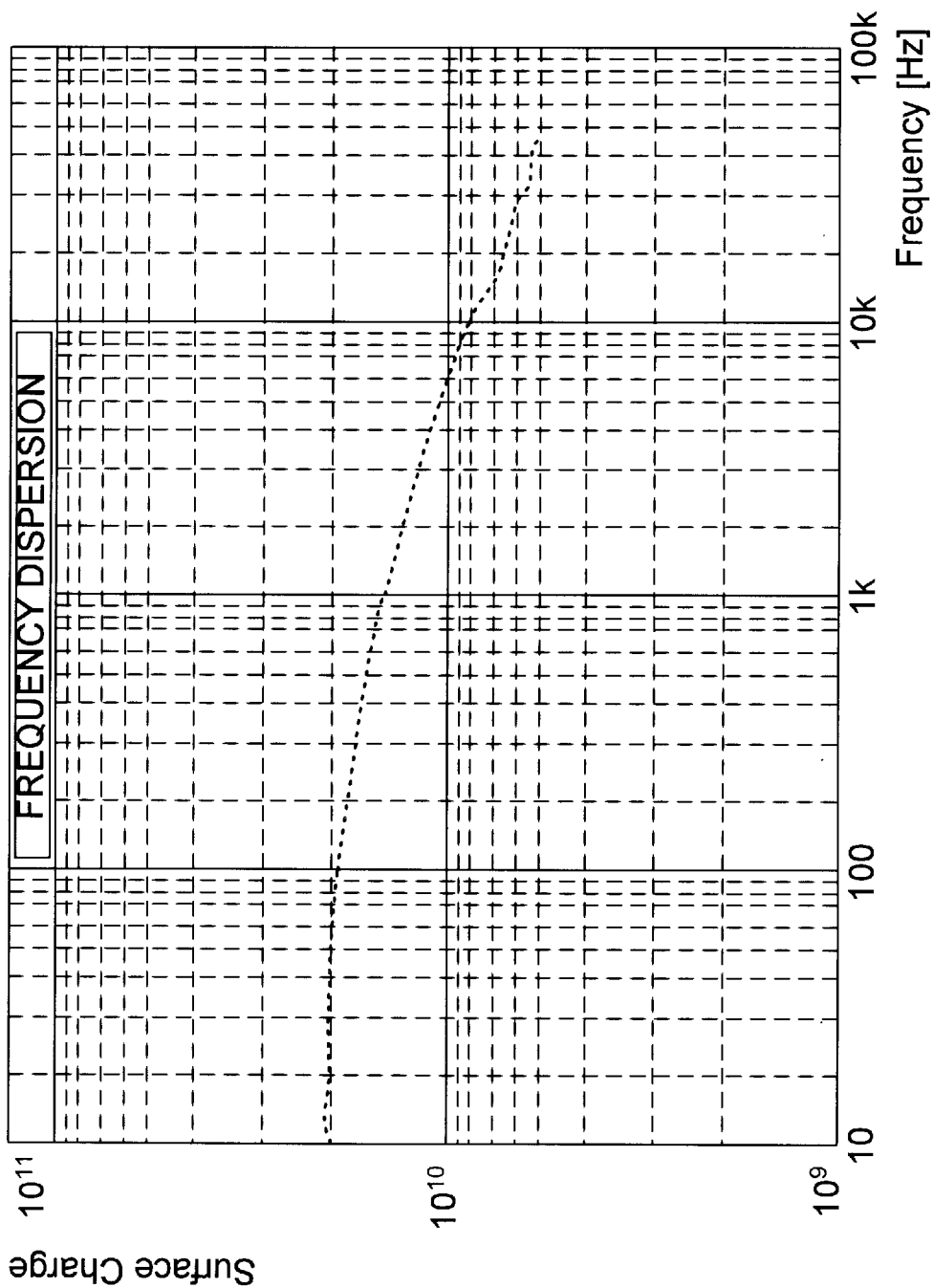
FIG. 7b is a graph of surface charge versus light modulation frequency obtained during a second high-injection SPV frequency sweep of the backside surface of the control wafer following thermal treatment.

FIG. 7a is a graph of surface charge versus light modulation frequency obtained during a first high-injection SPV frequency sweep of a backside surface of the control wafer prior to thermal treatment. Surface charge is again almost constant at light modulation frequencies below the low frequency cutoff of the frequency range of interest, and decreases gradually with increasing light modulation frequency. FIG. 7b is a graph of surface charge versus light modulation frequency obtained during a second high-injection SPV frequency sweep of the backside surface of the control wafer following thermal treatment. Again, surface charge is almost constant at light modulation frequencies below the low frequency cutoff of the frequency range of interest, and decreases gradually with increasing light modulation frequency at medium and high frequencies. The curve of FIG. 7b is again basically the curve of FIG. 7a with an upward vertical shift probably due to the burning off of organic substances on the backside surface as the wafer was heated during the thermal treatment. The fact that the curve of FIG. 7b is almost identical to the curve of FIG. 7a shows that no heavy metal impurities were introduced into the backside surface of the control wafer during the thermal treatment.

Figure 8A:
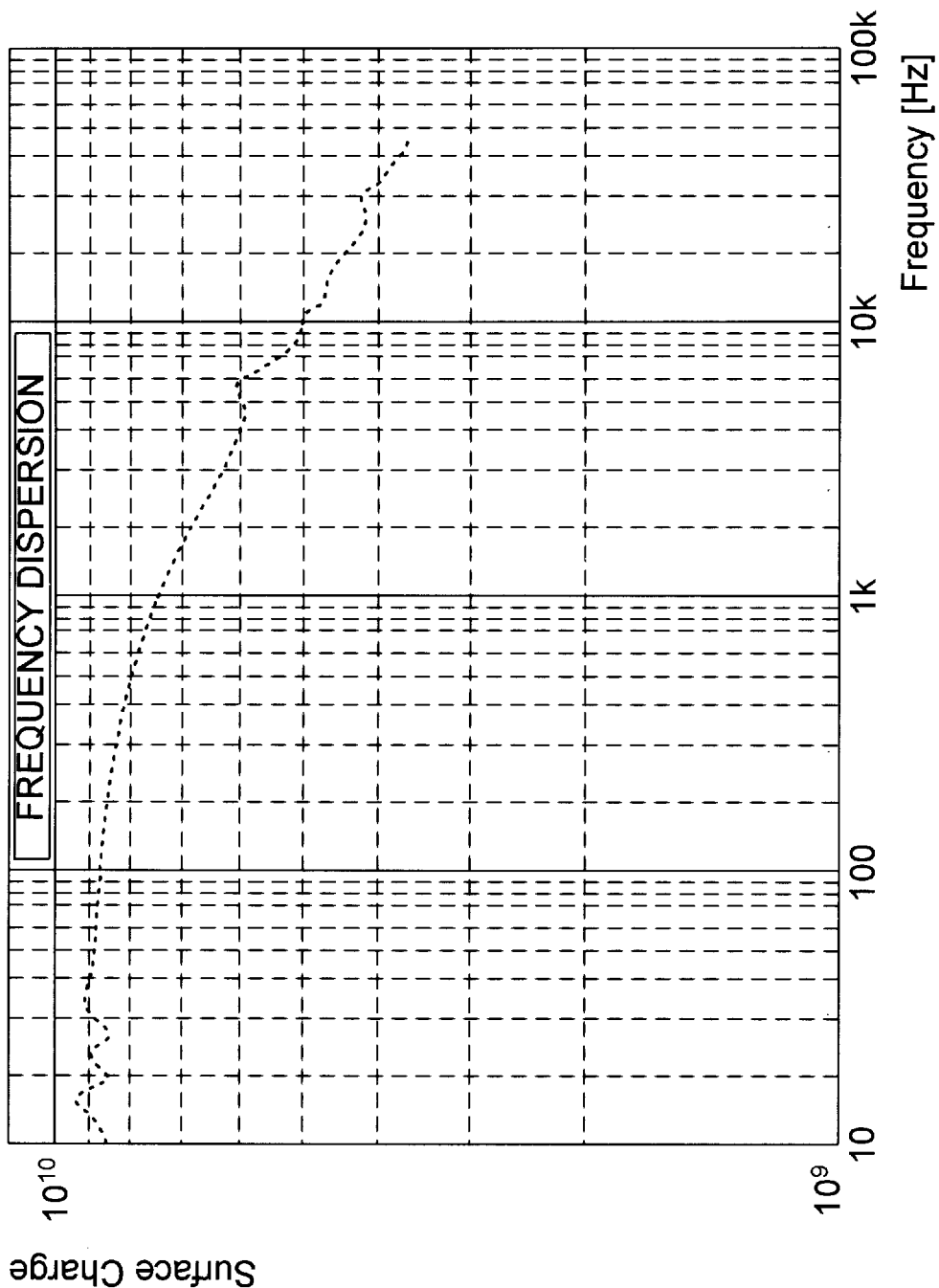
FIG. 8a is a graph of surface charge versus light modulation frequency obtained during a first high-injection SPV frequency sweep of a frontside surface of a processed wafer prior to implantation processing and thermal treatment.
Figure 8B:
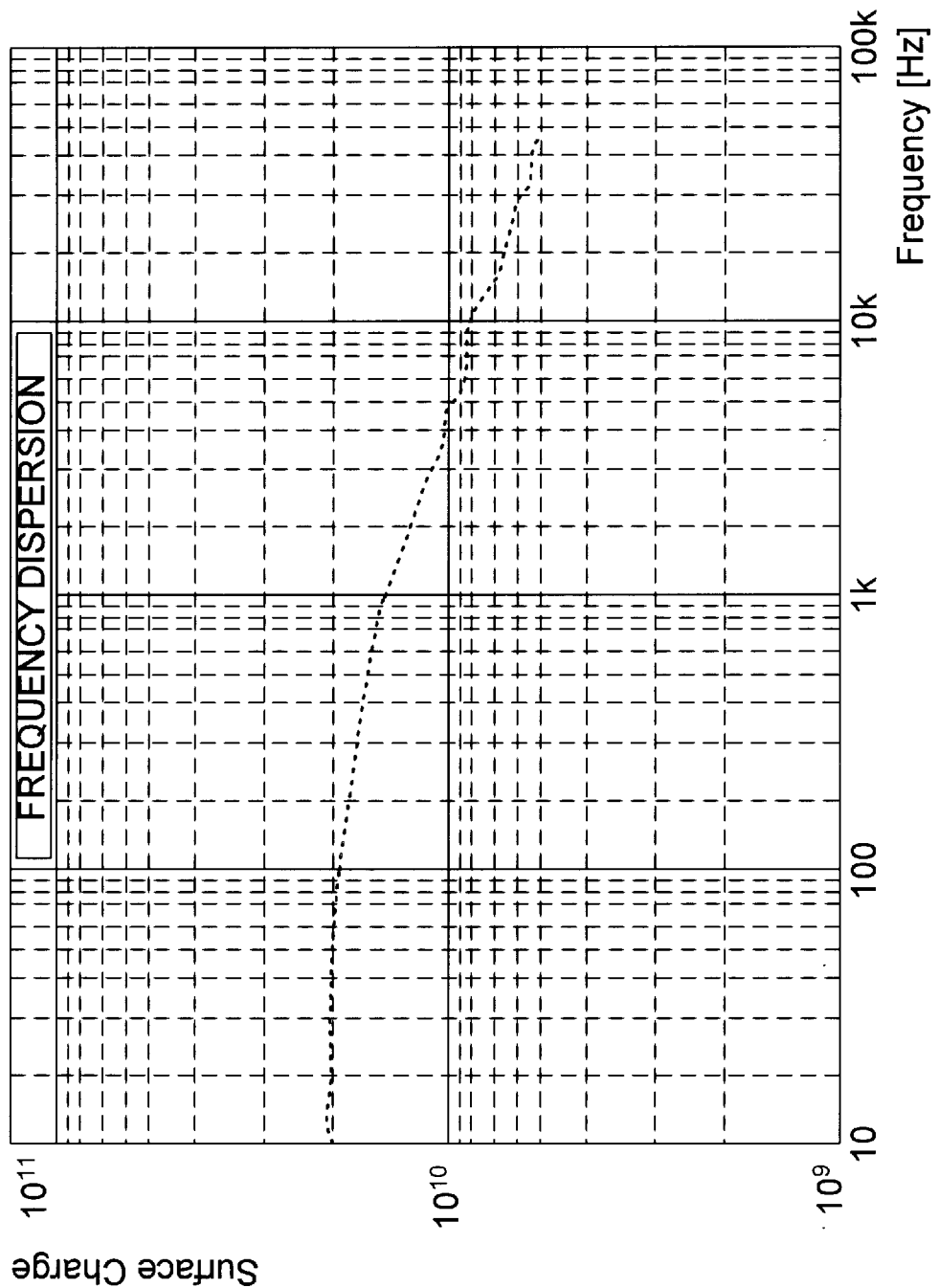
FIG. 8b is a graph of surface charge versus light modulation frequency obtained during a second high-injection SPV frequency sweep of the frontside surface of the processed wafer following implantation processing and thermal treatment.

FIG. 8a is a graph of surface charge versus light modulation frequency obtained during a first high-injection SPV frequency sweep of a frontside surface of a processed wafer prior to implantation processing and thermal treatment. Surface charge is almost constant at light modulation frequencies below the low frequency cutoff of the frequency range of interest, and decreases gradually with increasing light modulation frequency. FIG. 8b is a graph of surface charge versus light modulation frequency obtained during a second high-injection SPV frequency sweep of the frontside surface of the processed wafer following implantation processing and thermal treatment. Again, surface charge is almost constant at light modulation frequencies below the low frequency cutoff of the frequency range of interest, and decreases gradually with increasing light modulation frequency. The curve of FIG. 8b is basically the curve of FIG. 8a with an upward vertical shift probably due to the burning off of organic substances on the frontside surface as the wafer was heated during the thermal treatment procedure. The fact that the curve of FIG. 8b is almost identical to the curve of FIG. 8a shows that no heavy metal impurities were introduced into the frontside surface of the processed wafer during implantation processing (i.e., from sources other than the dopant ion beam) or during the thermal treatment.

Figure 9:
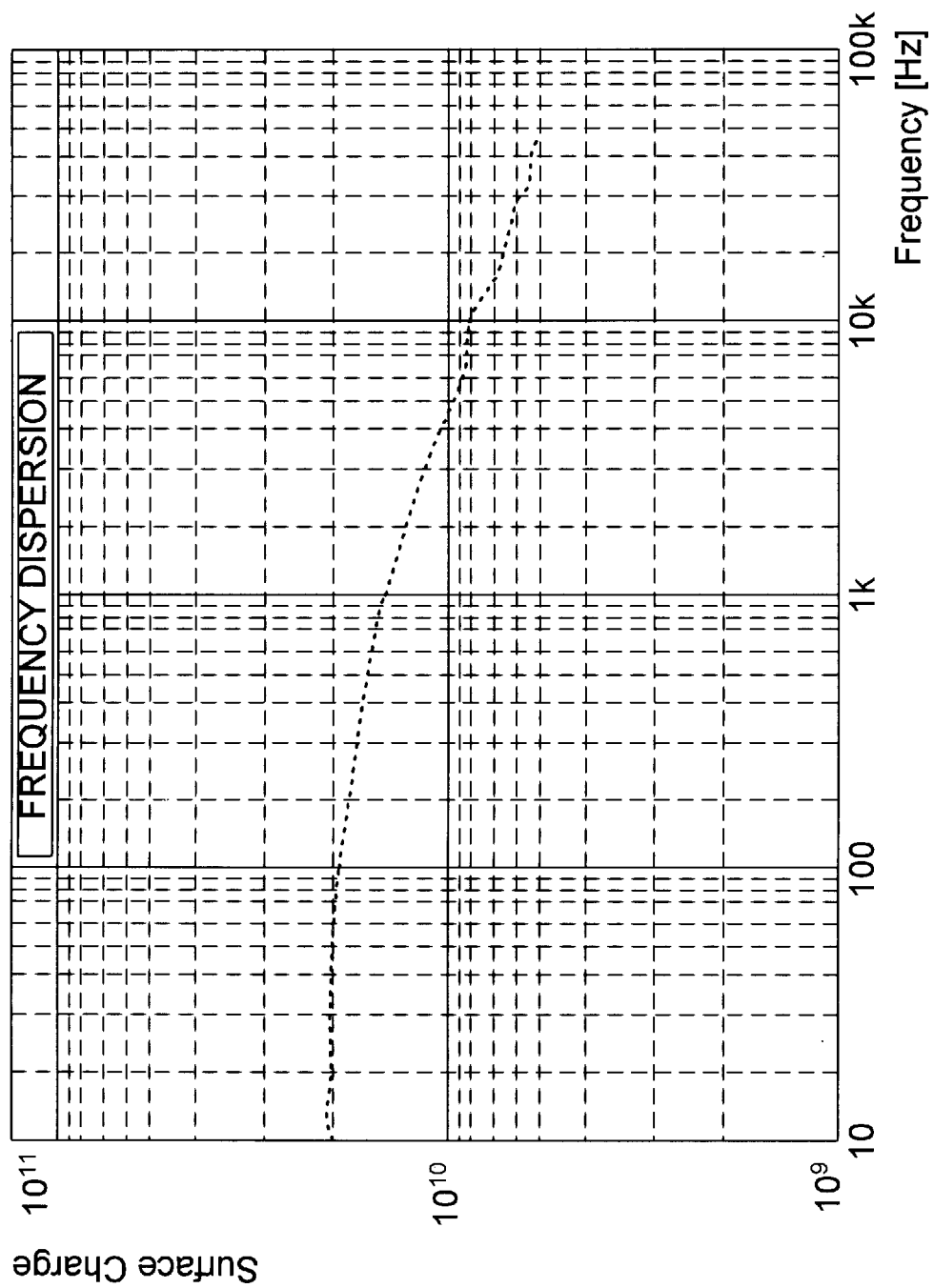
FIG. 9 is a graph of surface charge versus light modulation frequency obtained during a second high-injection SPV frequency sweep of a backside surface of the processed wafer following implantation processing and thermal treatment.

FIG. 9 is a graph of surface charge versus light modulation frequency obtained during a second high-injection SPV frequency sweep of a backside surface of the processed wafer following implantation processing and thermal treatment. Again, surface charge is almost constant at light modulation frequencies below the low frequency cutoff of the frequency range of interest, and decreases gradually with increasing light modulation frequency at medium and high frequencies. The fact that the curve of FIG. 9 is almost identical to the curves of FIGS. 8a and 8b shows that no heavy metal impurities were introduced into the backside surface of the processed wafer during implantation processing (i.e., during contact with metallic components of wafer clamps used to secure wafers during ion implantation) or during the thermal treatment.

Figure 10A:
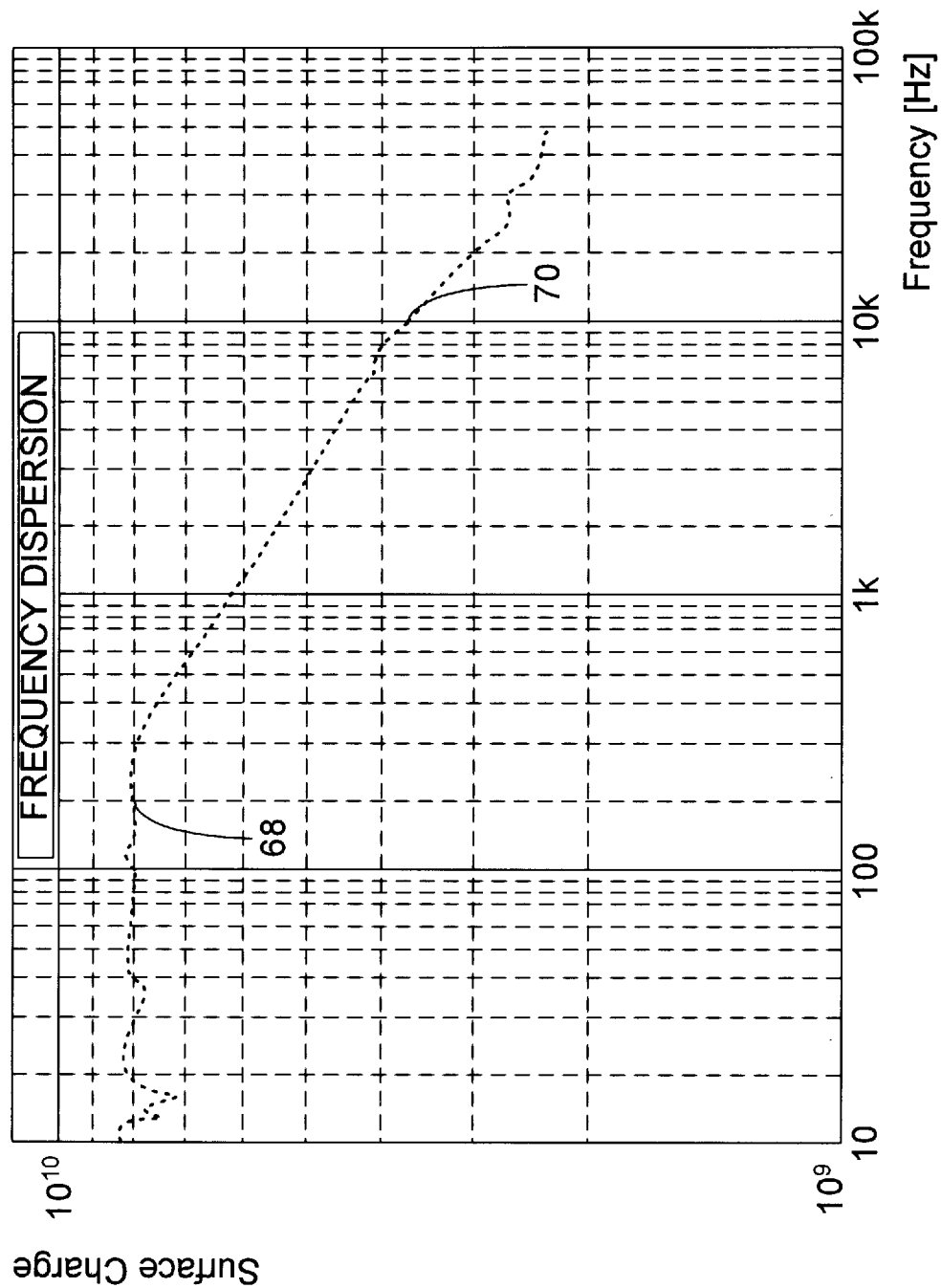
FIG. 10a is a graph of surface charge versus light modulation frequency obtained during a first high-injection SPV frequency sweep of a frontside surface of an implanted wafer prior to ion implantation and thermal treatment.
Figure 10B:
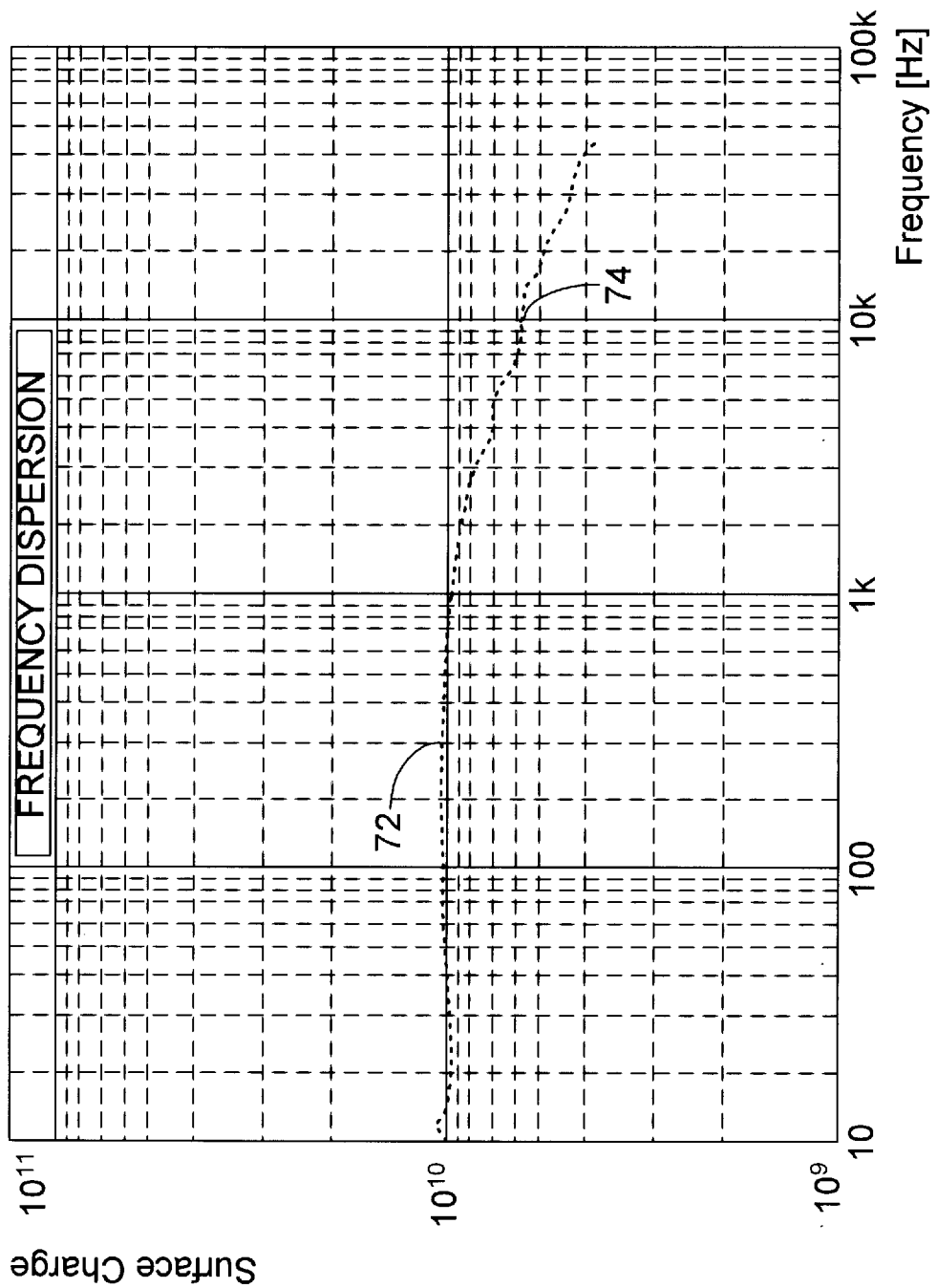
FIG. 10b is a graph of surface charge versus light modulation frequency obtained during a second high-injection SPV frequency sweep of the frontside surface of the implanted wafer following ion implantation and thermal treatment.

FIG. 10a is a graph of surface charge versus light modulation frequency obtained during a first high-injection SPV frequency sweep of a frontside surface of an implanted wafer prior to ion implantation and thermal treatment. Surface charge is almost constant at light modulation frequencies below about 600 Hz, and a definite decreasing trend (i.e., a "roll-off") is noted beginning at about 600 Hz. The curve of FIG. 10a is, however, very similar to the curve of FIG. 8a obtained for the processed wafer prior to thermal treatment. FIG. 10b is a graph of surface charge versus light modulation frequency obtained during a second high-injection SPV frequency sweep of the frontside surface of the implanted wafer following ion implantation and thermal treatment. Compared to the curve of FIG. 10a, the curve of FIG. 10b has an upward vertical shift and a substantially reduced roll-off beginning at about 600 Hz. Again, the vertical shift may be attributed to the burning off of organic substances on the frontside surface during the thermal treatment procedure. The significant differences between the curves of FIGS. 10a and 10b will be discussed in detail below.

Figure 11A:
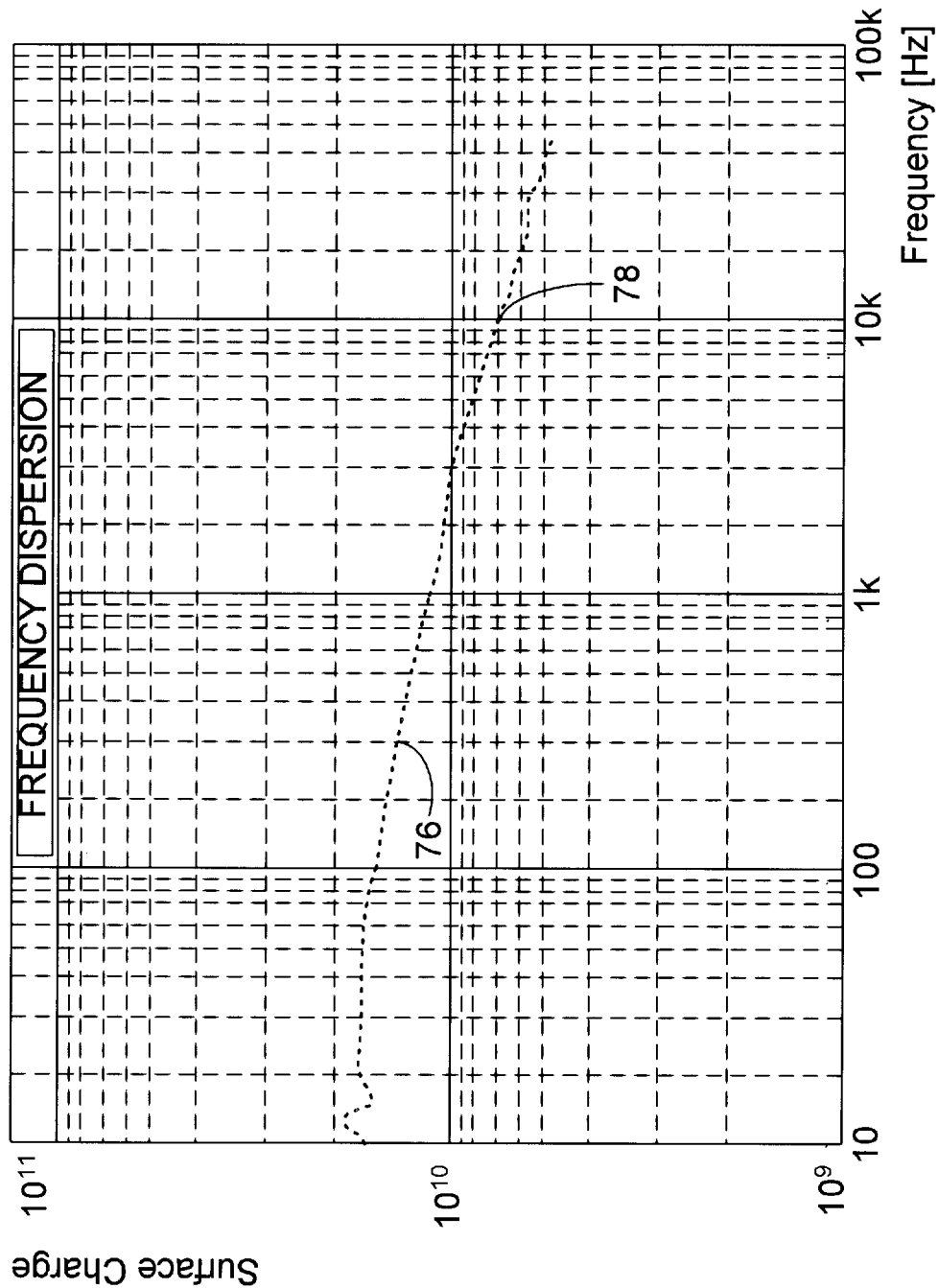
FIG. 11a is a graph of surface charge versus light modulation frequency obtained during a first high-injection SPV frequency sweep of a backside surface of the implanted wafer prior to ion implantation and thermal treatment.
Figure 11B:
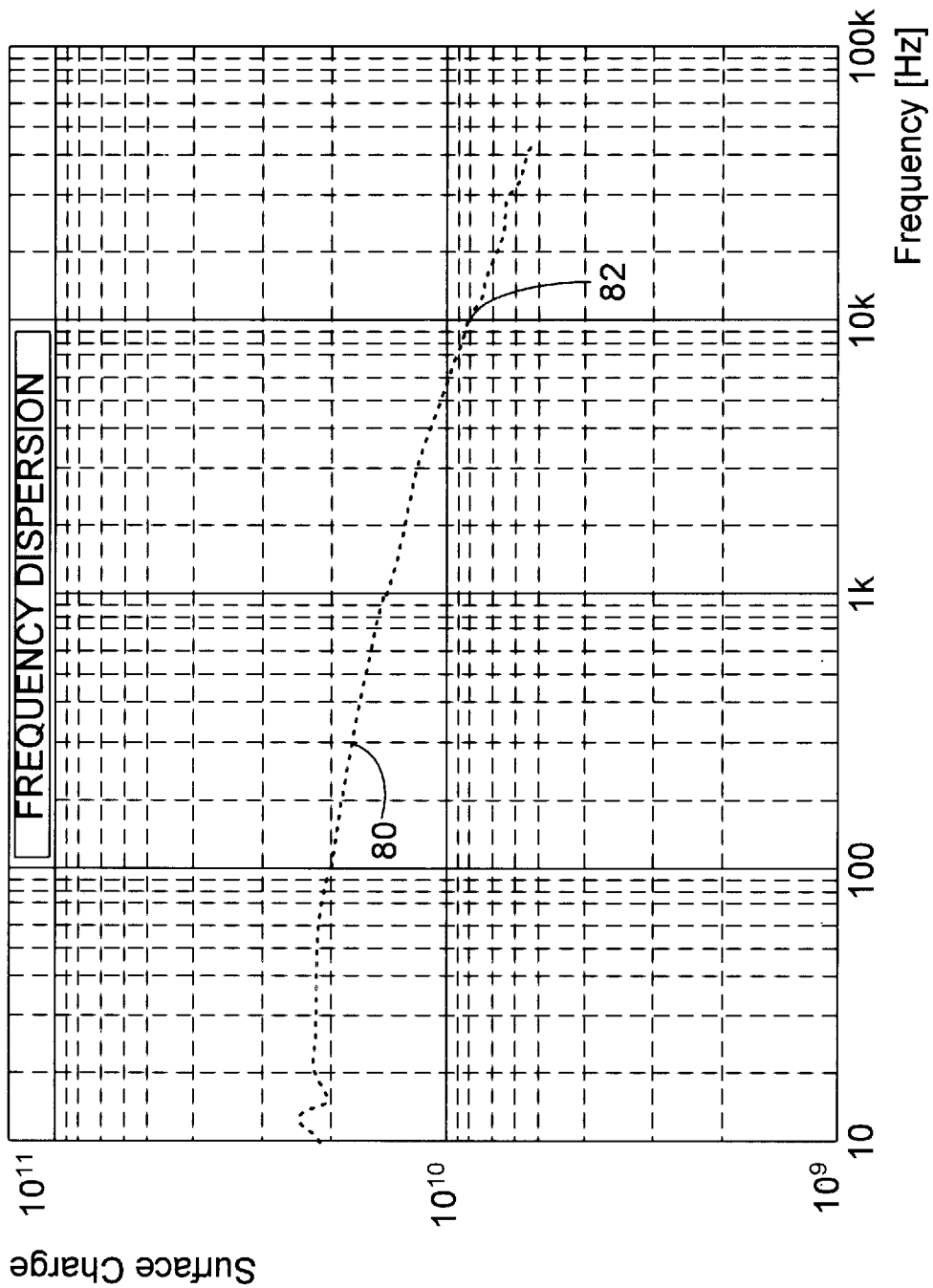
FIG. 11b is a graph of surface charge versus light modulation frequency obtained during a second high-injection SPV frequency sweep of the backside surface of the implanted wafer following ion implantation and thermal treatment.

FIG. 11a is a graph of surface charge versus light modulation frequency obtained during a first high-injection SPV frequency sweep of a backside surface of the implanted wafer prior to ion implantation and thermal treatment. Surface charge is almost constant at light modulation frequencies below the low frequency cutoff of the frequency range of interest, and decreases gradually with increasing light modulation frequency. FIG. 11b is a graph of surface charge versus light modulation frequency obtained during a second high-injection SPV frequency sweep of the backside surface of the implanted wafer following ion implantation and thermal treatment. Again, surface charge is almost constant at light modulation frequencies below the low frequency cutoff of the frequency range of interest, and decreases gradually with increasing light modulation frequency. The curve of FIG. 11b is very similar to the curve of FIG. 11a, with an upward vertical shift probably due to the burning off of organic substances on the backside surface as the wafer was heated during the thermal treatment procedure. The fact that the curve of FIG. 11b is almost identical to the curve of FIG. 11a shows that no heavy metal impurities were introduced into the backside surface of the implanted wafer during the ion implantation procedure.

As mentioned above, the curve of FIG. 10b has a substantially reduced roll-off beginning at about 600 Hz when compared to the curve of FIG. 10a. The "flattened" curve of FIG. 10b indicates a decrease in generation lifetime in the near-surface region adjacent to the frontside surface of the implanted wafer following thermal treatment. It is also noted that the curve of FIG. 10b is also flatter than the curve of FIG. 8b obtained for the processed wafer following thermal treatment. As results of high-injection SPV analyses are dominated by near-surface effects, the indicated decrease in generation lifetime is best explained by an increase in the number of heavy metal impurities (i.e., Fe atoms) present in the near-surface region of the frontside surface of the implanted wafer following thermal treatment. The thermal treatment has been ruled out as a possible source of heavy metal impurities, thus the heavy metal impurities must have been introduced into the implanted wafer during the ion implantation procedure. The backside surface of the implanted wafer has also been ruled out as a source of heavy metal impurities, thus the heavy metal impurities must have introduced into the frontside surface along with dopant ions during the ion implantation procedure. The reduction in generation lifetime is most probably due to the diffusion of heavy metal (Fe) impurities into the near-surface region adjacent to the frontside surface at the elevated temperatures associated with the thermal treatment. These Fe atoms functioned as recombination centers within the near-surface region during the second high-injection SPV frequency sweep procedure, resulting in the noted reduction in generation lifetime within the near-surface region associated with the frontside surface.

It is noted that the extensive lattice damage surrounding the implant layer acted as a barrier to the diffusion of heavy metal impurities during the thermal treatment. Thus heavy metal impurities located below the implant layer (e.g., from the backside surface) were prevented from diffusing into the near-surface region associated with the frontside surface during the thermal treatment.

A simple comparison of ratios of surface charge values at the low frequency cutoff to surface charge values at the high frequency cutoff may be used to detect the presence of heavy metal contaminants within a near-surface region of an analyzed surface. Referring to the frequency sweep corresponding to the frontside surface of the implanted wafer prior to ion implantation and thermal treatment (FIG. 10$a$), a first surface charge value 68 measured at 281.80 Hz, substantially the low frequency cutoff of the frequency range of interest, was $0.80 \times 10^{10}$ Q/cm$^2$. A second surface charge value 70 measured at 10.0 kHz, the high frequency cutoff of the frequency range of interest, was $0.37 \times 10^{10}$ Q/cm$^2$. The ratio of first surface charge value 68 to second surface charge value 70 is thus 0.80/0.37, or about 2.16. Referring to the frequency sweep corresponding to the frontside surface of the implanted wafer following ion implantation and thermal treatment (FIG. 10$b$), a first surface charge value 72 measured at 281.80 Hz was $1.06 \times 10^{10}$ Q/cm$^2$. A second surface charge value 74 measured at 10.0 kHz was $0.58 \times 10^{10}$ Q/cm$^2$. The ratio of first surface charge value 72 to second surface charge value 74 is thus 1.06/0.58, or about 1.83. Thus the ratio after thermal treatment is thus about 15 percent lower than the ratio before thermal treatment. It is noted that this 15 percent decrease is associated with an increase in heavy metal (Fe) impurity concentration within the near-surface region adjacent to the frontside surface of the implanted wafer following thermal treatment. It is believed that a decrease in the ratio of surface charge at the low frequency cutoff to surface charge at the high frequency cutoff of at least 10 percent after thermal treatment is indicative of the added presence of heavy metal contaminants within a near-surface region associated with the analyzed surface.

Referring to the frequency sweep corresponding to the backside surface of the implanted wafer prior to ion implantation and thermal treatment (FIG. 11$a$), a first surface charge value 76 measured at 281.80 Hz, again substantially the low frequency cutoff of the frequency range of interest, was $1.52 \times 10^{10}$ Q/cm$^2$. A second surface charge value 78 measured at 10.0 kHz, the high frequency cutoff of the frequency range of interest, was $0.72 \times 10^{10}$ Q/cm$^2$. The ratio of first surface charge value 76 to second surface charge value 78 is thus 1.52/0.72, or about 2.11. Referring to the frequency sweep corresponding to the backside surface of the implanted wafer following ion implantation and thermal treatment (FIG. 11$b$), a first surface charge value 80 measured at 281.80 Hz was $1.80 \times 10^{10}$ Q/cm$^2$. A second surface charge value 82 measured at 10.0 kHz was $0.82 \times 10^{10}$ Q/cm$^2$. The ratio of first surface charge value 80 to second surface charge value 82 is thus 1.80/0.82, or about 2.20. The ratio after thermal treatment is thus only slightly higher than the ratio before thermal treatment, due to the fact that the concentration of heavy metal contaminants within the near-surface region adjacent to the backside surface did not change substantially.

It is noted that the first high-injection SPV frequency sweep procedure may have been performed on the processed and implanted wafers after implantation processing and before the thermal treatment. It is believed that similar results would have been obtained in this case.

Figure 12:
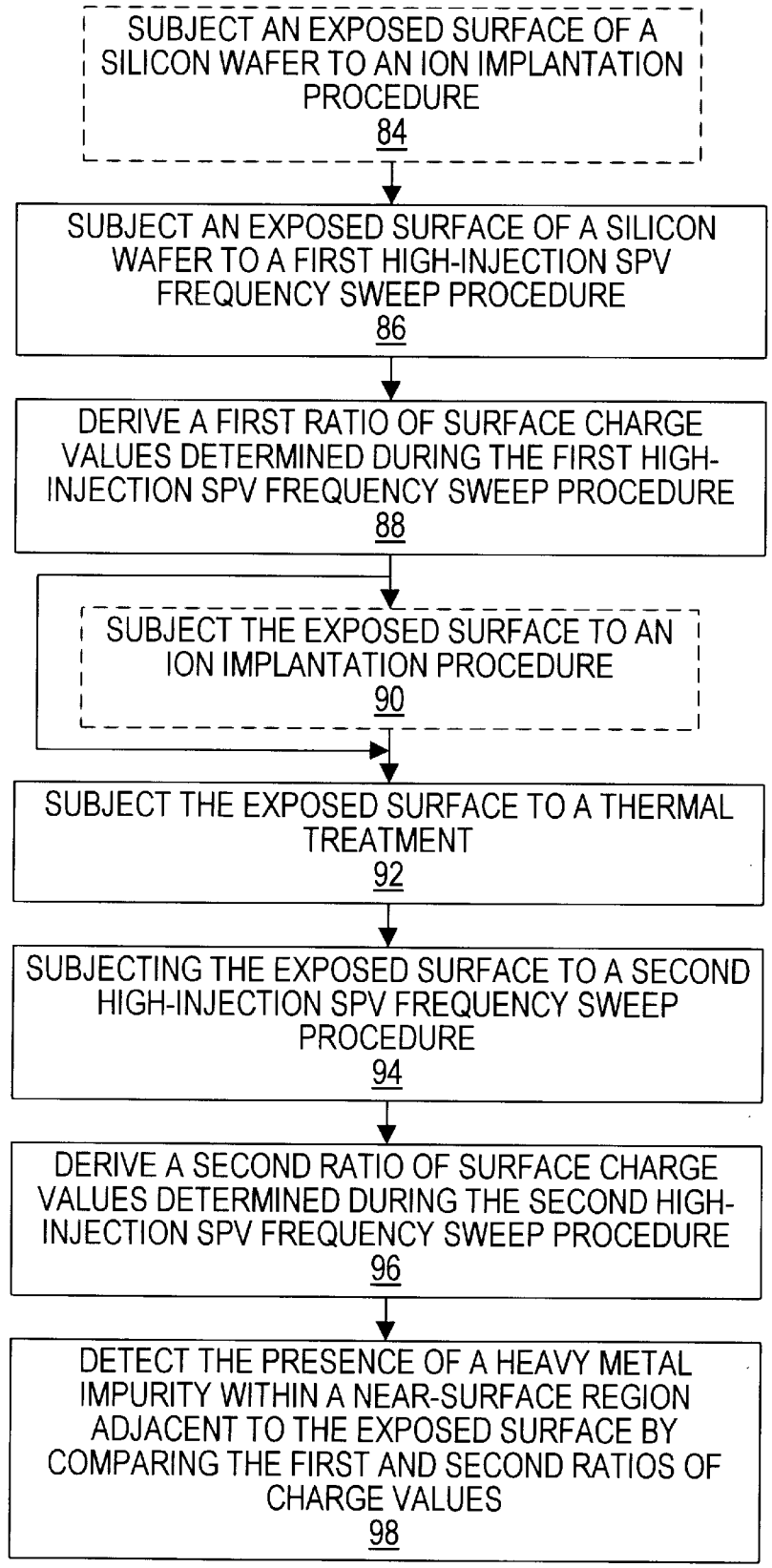
FIG. 12 is a flow chart of a method of detecting the presence of one or more heavy metal impurities within a silicon wafer subjected to an ion implantation procedure.

FIG. 12 is a flow chart of a method of detecting the presence of one or more heavy metal impurities within a silicon wafer subjected to an ion implantation procedure. A first high-injection SPV frequency sweep procedure may be performed before or after an exposed surface of a silicon wafer is subjected to an ion implantation procedure. If the first high-injection SPV frequency sweep is to be performed after ion implantation, the exposed surface of the silicon wafer is first subjected to an ion implantation procedure during a step 84. In either case, the exposed surface of the silicon wafer is subjected to a first high-injection SPV frequency sweep procedure during a step 86. The high-injection SPV frequency sweep procedure is described in detail below. During a step 88, a first ratio of surface charge at the low frequency cutoff to surface charge at the high frequency cutoff is derived. If the first high-injection SPV frequency sweep was performed before ion implantation, the exposed surface of the silicon wafer is next subjected to an ion implantation procedure during a step 90. In either case, the exposed surface of the silicon wafer is subjected to a thermal treatment as described above during a step 92. During a step 94, the exposed surface of the silicon substrate is subjected to a second high-injection SPV frequency sweep procedure as described below. A second ratio of surface charge at the low frequency cutoff to surface charge at the high frequency cutoff after thermal treatment is derived during a step 96. During a step 98, the presence of one or more heavy metal impurities within a near-surface region of the exposed surface of the silicon wafer is detected by comparing the first and second ratios. As described above, a second ratio which is at least 10 percent lower than the first ratio indicates the added presence of heavy metal contaminants within a near-surface region adjacent to the exposed surface following the thermal treatment.

Figure 13:
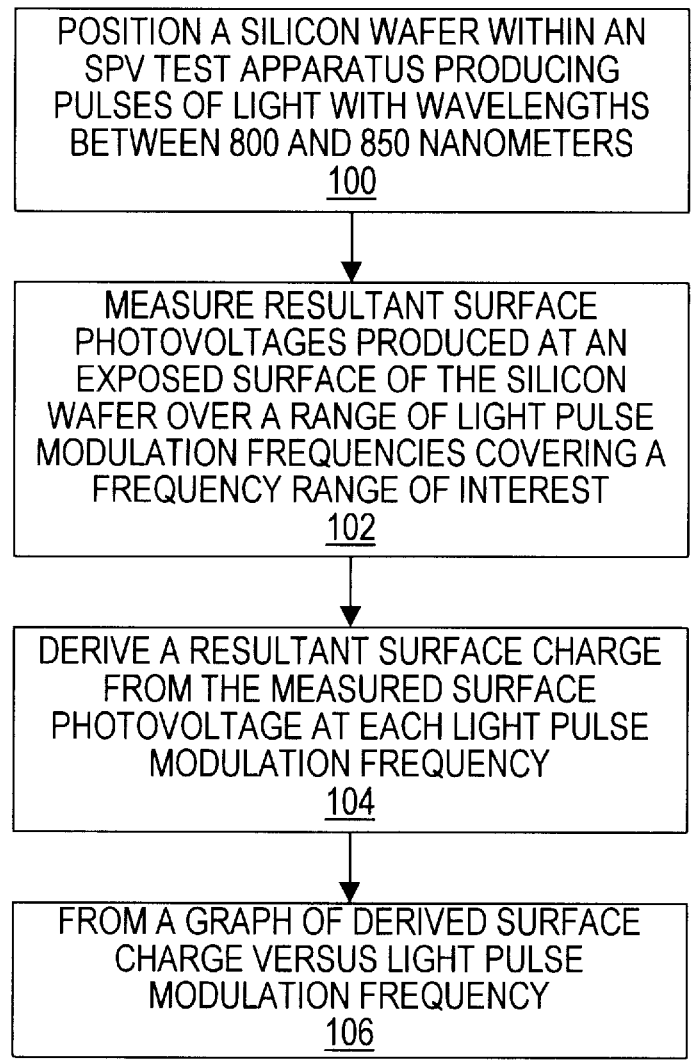
FIG. 13 is a flow chart of a high-injection SPV frequency sweep procedure.

FIG. 13 is a flow chart of a high-injection SPV frequency sweep procedure. During a first step 100, a silicon wafer is positioned within an SPV test apparatus producing pulses of light with wavelengths between 800 and 850 nanometers. An exposed surface of the silicon wafer is then subjected to light pulses modulated at frequencies ranging within a frequency range of interest. As described above, the frequency range of interest includes a low frequency cutoff and a high frequency cutoff. Resultant surface photovoltages produced at each modulation frequency are measured during a step 102. During a step 104, a surface charge value is derived from each measured surface photovoltage using the accepted relationship described above. During an optional step 106, a graph of derived surface charge versus light pulse modulation frequency is formed by plotting each derived surface charge at the corresponding light pulse modulation frequency pulse modulation frequency.

It will be appreciated to those skilled in the art having the benefit of this disclosure that this invention is believed to be a method of detecting the presence of heavy metal impurities within a near-surface region of a silicon wafer. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method of detecting the presence of a heavy metal impurity within a silicon wafer, comprising the steps of:

subjecting an exposed surface of the silicon wafer to an ion implantation procedure;

subjecting the exposed surface to a first high-injection SPV frequency sweep procedure;

deriving a first ratio of surface charge values determined during the first high-injection SPV frequency sweep procedure;

subjecting the exposed surface to a thermal treatment;

subjecting the exposed surface to a second high-injection SPV frequency sweep procedure;

deriving a second ratio of surface charge values determined during the second high-injection SPV frequency sweep procedure; and detecting the presence of a heavy metal impurity within the silicon wafer by comparing the first and second ratios of surface charge values.

2. The method as recited in claim 1, wherein the first and second high-injection SPV frequency sweep procedures comprise:

subjecting the exposed surface of the silicon wafer to a train of light pulses, said train of light pulses having a plurality of dissimilar modulation frequencies;

measuring a surface photovoltage at each of the plurality of dissimilar light pulse modulation frequencies; and deriving a surface charge from the measured surface photovoltage at each of the plurality of dissimilar light pulse modulation frequencies.

3. The method as recited in claim 2, wherein resultant surface photovoltages are produced at the exposed surface of the silicon wafer.

4. The method as recited in claim 2, wherein the wavelength of the light comprising the train of light pulses is between 800 nanometers and 850 nanometers.

5. The method as recited in claim 4, wherein the light comprising the train of light pulses is produced by a GaAlAs heterostructure laser diode.

6. The method as recited in claim 2, wherein the modulation frequencies of the train of light pulses cover a range from about 10 hertz to about 100 kilohertz.

7. The method as recited in claim 2, wherein the high-injection SPV frequency sweep procedure further comprises plotting each said surface charge at the corresponding light pulse modulation frequency.

8. The method as recited in claim 1, wherein the thermal treatment comprises heating the exposed surface of the silicon wafer to a temperature of about 220° C. for a time period of between 2 and 3 minutes.

9. The method as recited in claim 1, wherein the step of deriving the first ratio comprises dividing a first surface charge value by a second surface charge value, wherein the first surface charge value is derived from a surface photovoltage value measured at a low frequency cutoff of a frequency range of interest, and the second surface charge value is derived from a surface photovoltage value measured at a high frequency cutoff of the frequency range of interest.

10. The method as recited in claim 9, wherein the frequency range of interest extends from the low frequency cutoff to the high frequency cutoff.

11. The method as recited in claim 10, wherein the low frequency cutoff is about 280 Hz.

12. The method as recited in claim 10, wherein the high frequency cutoff is about 10 kHz.

13. The method as recited in claim 1, wherein the step of deriving the second ratio comprises dividing a first surface charge value by a second surface charge value, wherein the first surface charge value is derived from a surface photovoltage value measured at a low frequency cutoff of a frequency range of interest, and the second surface charge value is derived from a surface photovoltage value measured at a high frequency cutoff of the frequency range of interest.

14. The method as recited in claim 13, wherein the frequency range of interest extends from the low frequency cutoff to the high frequency cutoff.

15. The method as recited in claim 14, wherein the low frequency cutoff is about 280 Hz.

16. The method as recited in claim 14, wherein the high frequency cutoff is about 10 kHz.

17. The method as recited in claim 1, wherein during the detecting step, the second surface charge ratio being at least 10 percent lower than the first surface charge ratio indicates the presence of a heavy metal impurity within the near-surface region of the silicon wafer.

18. A method of detecting the presence of a heavy metal impurity within a silicon wafer, comprising the steps of:

subjecting an exposed surface of the silicon wafer to a first high-injection SPV frequency sweep procedure;

deriving a first ratio of surface charge values determined during the first high-injection SPV frequency sweep procedure;

subjecting the exposed surface to an ion implantation procedure;

subjecting the exposed surface to a thermal treatment;

subjecting the exposed surface to a second high-injection SPV frequency sweep procedure;

deriving a second ratio of surface charge values determined during the second high-injection SPV frequency sweep procedure; and detecting the presence of a heavy metal impurity within the silicon wafer by comparing the first and second ratios of surface charge values.

19. The method as recited in claim 18, wherein the first and second high-injection SPV frequency sweep procedures comprise:

subjecting the exposed surface of the silicon wafer to a train of light pulses, said train of light pulses having a plurality of dissimilar modulation frequencies;

measuring a surface photovoltage at each of the plurality of dissimilar light pulse modulation frequencies; and deriving a surface charge from the measured surface photovoltage at each of the plurality of dissimilar light pulse modulation frequencies.

20. The method as recited in claim 19, wherein resultant surface photovoltages are produced at the exposed surface of the silicon wafer.

21. The method as recited in claim 19, wherein the wavelength of the light comprising the train of light pulses is between 800 nanometers and 850 nanometers.

22. The method as recited in claim 19, wherein the light comprising the train of light pulses is produced by a GaAlAs heterostructure laser diode.

23. The method as recited in claim 19, wherein the modulation frequencies of the train of light pulses cover a range from about 10 hertz to about 100 kilohertz.

24. The method as recited in claim 19, wherein the high-injection SPV frequency sweep procedure further comprises plotting each said surface charge at the corresponding light pulse modulation frequency.

25. The method as recited in claim 18, wherein the thermal treatment comprises heating the exposed surface of the silicon wafer to a temperature of about 220° C. for a time period of between 2 and 3 minutes.

26. The method as recited in claim 18, wherein the step of deriving the first ratio comprises dividing a first surface charge value by a second surface charge value, wherein the first surface charge value is derived from a surface photovoltage value measured at a low frequency cutoff of a frequency range of interest, and the second surface charge value is derived from a surface photovoltage value measured at a high frequency cutoff of the frequency range of interest.

27. The method as recited in claim 26, wherein the frequency range of interest extends from the low frequency cutoff to the high frequency cutoff.

28. The method as recited in claim 27, wherein the low frequency cutoff is about 280 Hz.

29. The method as recited in claim 27, wherein the high frequency cutoff is about 10 kHz.

30. The method as recited in claim 18, wherein the step of deriving the second ratio comprises dividing a first surface charge value by a second surface charge value, wherein the first surface charge value is derived from a surface photovoltage value measured at a low frequency cutoff of a frequency range of interest, and the second surface charge value is derived from a surface photovoltage value measured at a high frequency cutoff of the frequency range of interest.

31. The method as recited in claim 30, wherein the frequency range of interest extends from the low frequency cutoff to the high frequency cutoff.

32. The method as recited in claim 31, wherein the low frequency cutoff is about 280 Hz.

33. The method as recited in claim 31, wherein the high frequency cutoff is about 10 kHz.

34. The method as recited in claim 18, wherein during the detecting step, the second surface charge ratio being at least 10 percent lower than the first surface charge ratio indicates the presence of a heavy metal impurity within the near-surface region of the silicon wafer.

* * * * *